(12) United States Patent
Gotrik et al.

(10) Patent No.: US 11,999,188 B2
(45) Date of Patent: Jun. 4, 2024

(54) PATTERNED TRANSFER ARTICLES

(71) Applicant: 3M INNOVATIVE PROPERTIES COMPANY, St. Paul, MN (US)

(72) Inventors: Kevin W. Gotrik, Hudson, WI (US); Scott J. Jones, Woodbury, MN (US); Huiwen Tai, Lake Elmo, MN (US); Joan M. Frankel, Woodbury, MN (US); Robert R. Owings, Woodbury, MN (US); Bhaskar V. Velamakanni, Woodbury, MN (US); Jeanne M. Bruss, Cottage Grove, MN (US); David J. Rowe, Roseville, MN (US); Matthew E. Sousa, Rosemount, MN (US); Bradley L. Givot, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 314 days.

(21) Appl. No.: 17/610,498

(22) PCT Filed: May 26, 2020

(86) PCT No.: PCT/IB2020/054988
§ 371 (c)(1),
(2) Date: Nov. 11, 2021

(87) PCT Pub. No.: WO2020/240419
PCT Pub. Date: Dec. 3, 2020

(65) Prior Publication Data
US 2022/0234382 A1    Jul. 28, 2022

Related U.S. Application Data

(60) Provisional application No. 62/855,651, filed on May 31, 2019.

(51) Int. Cl.
*B44C 1/17* (2006.01)
*C23C 14/58* (2006.01)

(52) U.S. Cl.
CPC ........ *B44C 1/1708* (2013.01); *C23C 14/5886* (2013.01)

(58) Field of Classification Search
CPC ......... B44C 1/165; B44C 1/17; B44C 1/1708; B44C 1/1712; B44C 1/1716; B44C 1/172;
(Continued)

(56) References Cited

U.S. PATENT DOCUMENTS 5,260,139 A * 11/1993 Shiraishi ................ B41M 5/423
428/206
7,018,713 B2    3/2006 Padiyath
(Continued)

FOREIGN PATENT DOCUMENTS

| CN | 106541723 | 3/2017 |
| CN | 108574748 | 9/2018 |

(Continued)

OTHER PUBLICATIONS

International Search Report for PCT International Application No. PCT/IB2020/054988, dated Oct. 22, 2020, 6 pages.

*Primary Examiner* — Zachary M Davis

(57) ABSTRACT

A transfer article with a thickness of less than 3 micrometers includes a first acrylate layer that is releasable from a metal or doped semiconductor release layer at a release value of from 2 to 50 grams/inch. The article includes a functional layer overlaying the first acrylate layer. The functional layer includes at least one microfractured inorganic layer about 3 nanometers to about 200 nanometers thick, which has a plurality of toolmarks interspersed with cracks.

20 Claims, 9 Drawing Sheets

(58) Field of Classification Search
CPC ... B44C 1/1725; B44C 1/1733; B44C 1/1737; B44C 1/1741; B44C 1/1745
See application file for complete search history.

(56) References Cited

U.S. PATENT DOCUMENTS

| | | |
|---|---|---|
| 8,658,248 B2 | 2/2014 | Anderson |
| 2010/0316852 A1 | 12/2010 | Condo |
| 2016/0016338 A1 | 1/2016 | Radcliffe |
| 2016/0164013 A1 | 6/2016 | Lee |
| 2017/0267006 A1 | 9/2017 | Ikeda et al. |
| 2018/0009143 A1 | 1/2018 | Abe et al. |
| 2019/0315093 A1 | 10/2019 | Nishio et al. |
| 2019/0381821 A1 | 12/2019 | Schmidt |

FOREIGN PATENT DOCUMENTS

| | | |
|---|---|---|
| EP | 1144197 | 10/2001 |
| JP | 2017105191 | 6/2017 |
| JP | 2019064100 A | 4/2019 |
| KR | 102018000164 | 1/2018 |
| WO | 0041893 A1 | 7/2000 |
| WO | WO 2017-136382 | 8/2017 |
| WO | WO 2018-103012 | 6/2018 |
| WO | WO 2018-178802 | 10/2018 |
| WO | WO 2018-178803 | 10/2018 |

\* cited by examiner

PATTERNED TRANSFER ARTICLES

CROSS REFERENCE TO RELATED APPLICATIONS

This application is a national stage filing under 35 U.S.C. 371 of PCT/IB2020/054988, filed May 26, 2020, which claims the benefit of U.S. Provisional Application No. 62/855,651, filed May 31, 2019, the disclosures of which are incorporated by reference in their entireties herein.

BACKGROUND

Sputtering is a high-precision vacuum deposition process that can deposit inorganic thin films with single digit nanometer thickness control across large areas, and can be suitable for roll-to-roll manufacturing. Vacuum-deposition substrates should have sufficient temperature and chemical stability to remain substantially free of distortion and degradation when exposed to the high temperatures, ultraviolet (UV) radiation, and ions utilized in sputtering processes. Suitable vacuum-deposition substrate materials should also have vacuum stability, and outgas substantially no volatile compounds when exposed to the low pressures in a vacuum chamber.

Sputtering can be used to deposit stacks of inorganic thin film layers such as, for example, metal layers and metal oxide layers, on a substrate. Materials, thicknesses and the order of arrangement of the thin film inorganic layers with different indices of refraction can be selected to fine-tune the aesthetic appearance and transmissive properties of an article. For example, an article with stacks of multiple metal and metal oxide layers can appear to have different colors when viewed at a different viewing angles.

SUMMARY

Articles including stacks of dim film inorganic layers sputter-deposited on a substrate can have a very desirable aesthetic appearance. However, when the articles are applied to a surface, particularly a surface with compound curvature, the metal layers can be stretched or strained, which can form visible crack-like defects that undesirably alter the desired aesthetic or light management properties of the article. If the metal layers, the substrate on which the metal layers are applied, or both, are made of more stretchable materials, when the article is applied to a surface the metal layers are thinned in certain areas, which can cause an undesirable change in the appearance or light management performance of the article.

In general, the present disclosure is directed to transfer articles including a dimensionally stable, yet flexible, acrylate substrate having a functional layer thereon including at least one very thin film inorganic layer. In some examples, the inorganic layers in the functional layer of the transfer article are formed by a sputtering process and have a thickness of about 3 nm to about 200 nm. The transfer article containing the stable acrylate substrate and at least one thin inorganic layer is subsequently contacted by a tool and microfractured. The microfractured surface of the inorganic layer includes a plurality of toolmarks interspersed with a high density of cracks that are difficult for a human eye to resolve at a normal viewing distance of about 0.5 meters to 1 meter. In one example, the microfractured inorganic layer can include about 0.3 to about 2000 toolmarks per mm$^2$, and can include about 0.3 to about 10000 cracks per mm$^2$.

In some embodiments, when the transfer article including the microfractured inorganic layer, which is diffusely reflective, is stretched in at least one dimension and applied to a surface, the cracks in the microfractured inorganic layer expand in varying amounts as necessary to accommodate the stretching and straining during the application process and conform to the surface. Once applied to the surface, the transfer article forms a microcracked article with an arrangement of flakes separated by crevasses that are sufficiently small to provide a hazy appearance to a human observer at a normal viewing distance. The microcracked article has a substantially uniform surface that provides tunable reflectivity performance with consistent color and a good overall aesthetic appearance at a selected viewing angle with respect to a major surface thereof. Microfracturing the inorganic layer thus makes it possible to more effectively control the aesthetic appearance of an article including stacks of inorganic materials when the article is stretched in one or more directions and applied on or adhesively bonded to a compound surface to form a laminate article. Microfracturing the inorganic layer can also render the inorganic layer transmissive to electromagnetic signals within a desired frequency range, which can make the article useful in communication devices.

In one embodiment, the transfer article including the acrylate substrate having a functional layer thereon includes at least one very thin film inorganic layer is transferred to a low modulus substrate having a modulus range of about 50 MPa to about 1000 MPa. While on the low modulus substrate, at least one inorganic layer in the stack of inorganic thin film layers is pattern fractured against a tool to provide therein a microfractured inorganic layer having suitable arrangement of toolmarks interspersed with cracks. Transferring the inorganic thin layers to the low modulus substrate reduces the pressure needed to complete the patterning process, and increases the resolution of the toolmarks such that the toolmarks and interspersed cracks appear unresolvable to a human eye at normal viewing distances.

In one aspect, the present disclosure is directed to a transfer article, including:
  a first acrylate layer, wherein the first acrylate layer is releasable from a release layer comprising a metal layer or a doped semiconductor layer at a release value of from 2 to 50 grams/inch; and
  a functional layer overlaying the first acrylate layer, wherein the functional layer includes at least one microfractured inorganic layer having a plurality of toolmarks interspersed with cracks, wherein the microfractured inorganic layer is about 3 nanometers to about 200 nanometers thick; and wherein the transfer article has a thickness of less than 3 micrometers.

In another aspect, the present disclosure is directed to a method for making a patterned article, the method including:
  removing a transfer article from a release layer chosen from a metal layer or a doped semiconductor layer, the transfer article including:
  a first acrylate layer overlaying the release layer, wherein a release value between the release layer and the first acrylate layer is from 2 to 50 grams/inch, and
  a functional layer overlaying the first acrylate layer, wherein the functional layer includes at least one inorganic layer; and
  contacting the first acrylate layer with a tool including structures having a period of less than about 200 microns to form a plurality of toolmarks interspersed with cracks in at least one inorganic layer in the functional layer to provide a patterned article with a microfractured inorganic layer.

In another aspect, the present disclosure is directed to an article, including:
a functional layer with a first major surface and a second major surface, the functional layer including:
a first acrylate layer forming the first major surface, and
a functional layer on the first acrylate layer, the functional layer including a stack of metal layers with at least one microfractured metal layer having a plurality of toolmarks interspersed with cracks, and wherein the microfractured metal layer is about 5 nanometers to about 100 nanometers thick, and
a second acrylate layer forming the second major surface;
a first adhesive layer on the first acrylate layer,
a second adhesive layer on the second acrylate layer, wherein the second adhesive layer is optically clear;
a first polymeric film layer on the first adhesive layer, wherein the first polymeric film layer has a first major surface contacting the first adhesive layer, and a second major surface; and
a second polymeric film layer on the second adhesive layer.

In another aspect, the present disclosure is directed to a patterned antimicrobial article, including:
a functional layer comprising a first acrylate layer and a stack of metal layers and metal oxide layers on the first acrylate layer, wherein the stack of metal layers includes at least one microfractured silver or silver oxide layer having a plurality of toolmarks interspersed with cracks, wherein the microfractured metal layer is about 5 nanometers to about 100 nanometers thick; and
a substrate on the functional layer, wherein the substrate includes a polymeric film.

In another aspect, the present disclosure is directed to a dielectric article, including:
a patterned construction, including:
a functional layer including a first acrylate layer and a stack of metal layers and metal oxide layers on the first acrylate layer, wherein the stack of metal layers includes at least one microcracked metal layer having a plurality of metal flakes interspersed between crevasses, wherein at least a portion of the metal flakes reside out of a plane of the microcracked metal layer, and wherein the crevasses have an average width of about 1 micron to about 50 microns; and
at least one backing on the patterned construction, wherein the dielectric article has a tan δ maximum of 0.12 when measured in a QWED split post dielectric resonator cavity between 9 GHz and 10 GHz.

In another aspect, the present disclosure is directed to an article, including:
a polymeric film substrate;
a layer of an optically clear adhesive overlaying the polymeric film substrate;
a patterned construction overlaying the layer of the optically clear adhesive, the patterned construction including:
a functional layer including a first acrylate layer and a stack of metal layers and metal oxide layers on the first acrylate layer, wherein the stack of metal layers includes at least one microfractured metal layer having a plurality of toolmarks interspersed with cracks, wherein the microfractured metal layer is about 5 nanometers to about 100 nanometers thick; and
a backing on the patterned construction.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like symbols in the drawings indicate like elements.

DETAILED DESCRIPTION

Figure 1:
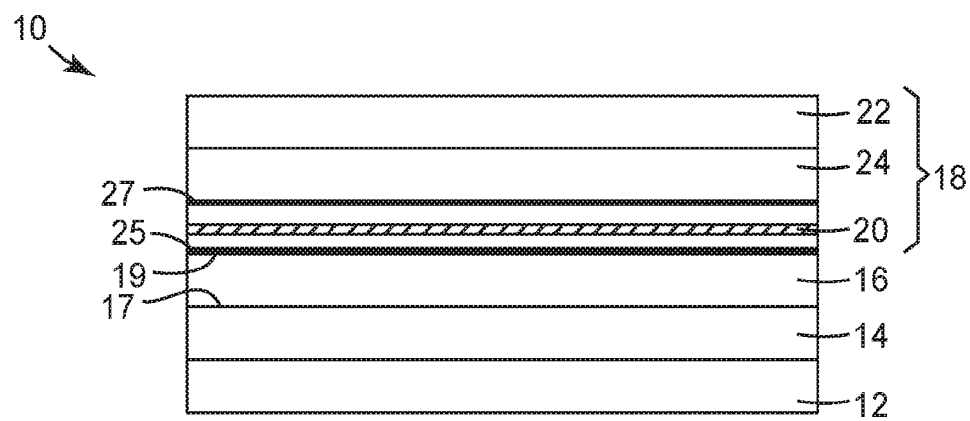
FIG. 1 is a schematic cross-sectional view of an embodiment of a transfer article according to the present disclosure.

Referring to FIG. 1, a transfer article 10 includes an optional release layer substrate 12 overlain with a release layer 14. A first acrylate layer 16 contacts the release layer 14 along a release surface 17. A functional layer 18 includes a first major surface 19 contacting the first acrylate layer 16. In various embodiments, the functional layer 18 can include a stack of one or more layers selected to provide the transfer article 10 with some functional property including, but not limited to, aesthetic properties, reflective or transmissive properties, environmental properties, antimicrobial properties, and the like. The functional layer 18 includes at least one inorganic layer 20, which may be located at any point within the functional layer 18, and in some embodiments may include one or more organic layers interspersed with the at least one inorganic layer 20. In the embodiment of FIG. 1, the functional layer 18 includes a second acrylate layer 24, which may be the same or different from the first acrylate layer 16. In the embodiment of FIG. 1, an optional adhesive layer 22 overlies the second acrylate layer 24 (if present). In some examples, the optional adhesive layer 22 may be used to attach the transfer article 10 to a surface of interest, or to another article (not shown in FIG. 1).

In various embodiments, the combination of the first acrylate layer 16 and the functional layer 18 has a thickness of less than about 3 micrometers, or less than 2 micrometers, or less than 1 micrometer, or less than 0.5 micrometers, or less than 0.25 micrometers, or less than 0.1 micrometers.

The optional release layer substrate 12 can include any material capable of supporting the release layer 14, and suitable examples include, but are not limited to, polymeric materials and metals. In some embodiments, the release layer substrate 12 can be heat-shrinkable, and can shrink at a predetermined temperature. Suitable release layer substrates 12 can be chosen from any organic polymeric layer that is processed to be heat-shrinkable by any suitable means. In one embodiment, the release layer substrate 12 is a semicrystalline or amorphous polymer that can be made heat-shrinkable by orienting at a temperature above its glass transition temperature, Tg, and then cooling. Examples of useful semicrystalline polymeric films include, but are not limited to, polyolefins such as polyethylene (PE), polypropylene (PP), and syndiotactic polystyrene (sPS); polyesters such as polyethylene terephthalate (PET), polyethylene napthalate (PEN), and polyethylene-2,6-naphthalate; fluorpolymers such as polyvinylidene difluoride, and ethylene: tetrafluoroethylene copolymers (ETFE); polyamides such as Nylon 6 and Nylon 66; polyphenylene oxide, and polyphenylene sulfide. Examples of amorphous polymer films include polymethylmethacrylate (PMMA), polyimides (PI), polycarbonate (PC), polyether sulfone (PES), atactic polystyrene (aPS), polyvinyl chloride (PVC), and norbornene based cyclic olefin polymer (COP) and cyclic olefin copolymer (COC). Some polymer materials are available in both semicrystalline and amorphous forms. Semicrystalline polymers such as those listed above can also be made heat-shrinkable by heating to the peak crystallization temperature and cooling.

In some embodiments, biaxially or uniaxially oriented polyethylene terephthalate (PET) with a thickness of approximately 0.002 inch (0.05 mm) is considered a convenient choice for the release layer substrate 12, as is biaxially oriented polypropylene (BOPP) film. Biaxially oriented polypropylene (BOPP) is commercially available from several commercial suppliers including, for example: ExxonMobil Chemical Company, Houston, TX; Continental Polymers, Swindon, UK; Kaisers International Corporation of Taipei City, Taiwan and PT Indopoly Swakarsa Industry (ISI) of Jakarta, Indonesia.

The release layer 14 can include a metal layer or a doped semiconductor layer. In the embodiment shown in FIG. 1, the first acrylate layer 16 is in direct contact with the release layer 14 and the functional layer 18. In the embodiment shown in FIG. 1, the optional release layer substrate 12 is in direct contact with the release layer 14, but in other embodiments there can be additional layers between the release layer substrate 12 and the release layer 14 (not shown in FIG. 1).

In some embodiments, a release value between the release layer 14 and the first acrylate layer 16 along the release surface 17 is less than 50 g/inch, 40 g/inch, 30 g/inch, 20 g/inch, 15 g/inch, 10 g/inch, 9 g/inch, 8 g/inch, 7 g/inch, 6 g/inch, 5 g/inch, 4 g/inch or 3 g/inch. In some embodiments, the release value between the release layer 14 and the first acrylate layer 16 is more than 1 g/inch, 2 g/inch, 3 g/inch or 4 g/inch. In some embodiments, the release value between the release layer 14 and the first acrylate layer 16 is from 1 to 50 g/inch, from 1 to 40 g/inch, from 1 to 30 g/inch, from 1 to 20 g/inch, from 1 to 15 g/inch, from 1 to 10 g/inch, from 1 to 8 g/inch from 2 to 50 g/inch, from 2 to 40 g/inch, from 2 to 30 g/inch, from 2 to 20 g/inch, from 2 to 15 g/inch, from 2 to 10 g/inch, or from 2 to 8 g/inch.

The transfer article 10 can be used to transfer the first acrylate layer 16 and the functional layer 18 thereon, so that the release layer 14 and/or the release layer substrate 12 can be reused. In one example, the transfer article 10 can be applied to a surface of interest with the functional layer 18 being between the first acrylate layer 16 and the surface of interest. After the transfer article 10 is applied to the surface of interest, the release layer 14 and the substrate 12, if present, can be removed from the transfer article 10. The first acrylate layer 16 and the functional layer 18 then remain on the surface of interest. In some embodiments, the optional adhesive layer 22 can help the functional layer 18 more effectively attach to the surface of interest.

In some embodiments, the release layer 14 can include a metal layer chosen from individual elemental metals, two or more metals as mixtures, inter-metallics or alloys, semimetals or metalloids, metal oxides, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxy borides, metal and mixed metal silicides, diamond-like carbon, diamond-like glass, graphene, and combinations thereof. In some embodiments, which are not intended to be limiting, the release layer 14 may conveniently be formed of Al, Zr, Cu, NiCr, NiFe, Ti, or Nb, and may have a thickness between about 3 nm and about 3000 nm.

In some embodiments, the release layer 14 can include a doped semiconductor layer. In some embodiments, which are not intended to be limiting, the doped semiconductor layer may conveniently be formed of Si, B-doped Si, Al-doped Si, P-doped Si with thicknesses between about 3 nm to about 3000 nm. A particularly suitable doped semiconductor layer for the release layer 14 is Al-doped Si, wherein the Al compositional percentage is about 10%.

In various example embodiments, the release layer 14 is prepared by evaporation, reactive evaporation, sputtering, reactive sputtering, chemical vapor deposition, plasma enhanced chemical vapor deposition, and atomic layer deposition The first and second acrylate layers 16, 24 in the transfer article 10 may be made from the same material or different materials. In some embodiments, the first acrylate layer 16 or the second acrylate layer 24 can include an acrylate or an acrylamide. When the acrylate layers are to be formed by flash evaporation of the monomer, vapor deposition, followed by crosslinking, volatilizable acrylate and methacrylate (referred to herein as "(meth)acrylate") or acrylamide or methacrylamide (referred to herein as "(meth)acrylamide") monomers are useful, with volatilizable acrylate monomers being preferred. In various embodiments, a suitable (meth) acrylate or (meth) acrylamide monomer has sufficient vapor pressure to be evaporated in an evaporator and condensed into a liquid or solid coating in a vapor coater, deposited as a spin-on coating, and the like.

Examples of suitable monomers include, but are not limited to, hexanediol diacrylate; ethoxyethyl acrylate; cyanoethyl (mono)acrylate; isobornyl (meth)acrylate; octadecyl acrylate; isodecyl acrylate; lauryl acrylate; beta-carboxyethyl acrylate; tetrahydrofurfuryl acrylate; dinitrile acrylate; pentafluorophenyl acrylate; nitrophenyl acrylate; 2-phenoxyethyl (meth)acrylate; 2,2,2-trifluoromethyl (meth)acrylate; diethylene glycol diacrylate; triethylene glycol di(meth)acrylate; tripropylene glycol diacrylate; tetraethylene glycol diacrylate; neo-pentyl glycol diacrylate; propoxylated neopentyl glycol diacrylate; polyethylene glycol diacrylate; tetraethylene glycol diacrylate; bisphenol A epoxy diacrylate; 1,6-hexanediol dimethacrylate; trimethylol propane triacrylate; ethoxylated trimethylol propane triacrylate; propylated trimethylol propane triacrylate; tris(2-hydroxyethyl)-isocyanurate triacrylate; pentaerythritol triacrylate; phenylthioethyl acrylate; naphthloxyethyl acrylate; neopentyl glycol diacrylate, MIRAMER M210 (available from Miwon Specialty Chemical Co., Ltd., Korea), KAYARAD R-604 (available from Nippon Kayaku Co., Ltd., Tokyo, Japan), epoxy acrylate under the product number RDX80094 (available from RadCure Corp., Fairfield, N.J.); and mixtures thereof. A variety of other curable materials can be included in the polymer layer, such as, e.g., vinyl ethers, vinyl napthalene, acrylonitrile, and mixtures thereof.

Tricyclodecane dimethanol diacrylate can be used as an acrylate material for any of the component layers in the functional layer, and in some embodiments may be applied by, e.g., condensed organic coating followed by UV, electron beam, or plasma initiated free radical polymerization. A thickness between about 10 nm and 10000 nm for the acrylate layers 16, 24 is considered convenient, with a thickness of about 10 nm and 5000 nm being considered particularly suitable. In some embodiments, the thickness of the acrylate layers 16, 24 can be between about 10 nm and 3000 nm.

In some embodiments, the functional layer 18 is an aesthetic optical layer that can have reflective, anti-reflective, partially absorbing, polarizing, retarding, diffractive, scattering, or transmissive properties over electromagnetic wavelengths of interest. The functional layer includes at least one or a plurality of inorganic layers 20, which in various embodiments include metal layers and metal oxide layers, which may have the same or different thicknesses and indices of refraction chosen to provide a predetermined optical effect over the electromagnetic wavelengths of interest.

In various embodiments, the functional layer 18 has a thickness of less than about 5 microns, or less than about 2 microns, or less than about 1 micron, or less than about 0.5 microns.

In various embodiments, which are not intended to be limiting, the inorganic layer 20 in the functional layer 18 can include a metal chosen from individual elemental metals, two or more metals as mixtures, inter-metallics or alloys, semi-metals or metalloids, metal oxides, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxy borides, metal and mixed metal silicides, diamond-like carbon, diamond-like glass, graphene, and combinations thereof. In some embodiments, which are not intended to be limiting, the inorganic layer 20 is chosen from Ag, Al, Ge, Au, Si, Ni, Cr, Co, Fe, Nb, and mixtures, alloys and oxides thereof. In some embodiments, the inorganic layer 20 of the functional layer 18 includes layers of metal oxides such as, for example, SiAlOx, NbOx, and mixtures and combinations thereof, which are interspersed with the metal layers.

In some embodiments, the inorganic layer or layers 20 are applied by sputtering, evaporation, or flash evaporation, and a thickness between about 3 and about 200 nm, or about 3 to about 100 nm, or about 3 nm to about 50 nm, or about 3 nm to about 20 nm, or about 3 nm to about 15 nm, or about 3 nm to about 10 nm, or about 3 nm to about 5 nm.

In some embodiments, the functional layer 18 includes a stack of a plurality of metal layers, wherein at least some of the metal layers in the stack are separated by metal oxide layers, polymeric layers, or mixtures and combinations thereof. In various embodiments, each metal layer in the stack can have substantially the same thickness, or the metal layers in the stack can have different thicknesses. In some embodiments, which are not intended to be limiting, each inorganic layer in the plurality of inorganic layers has a thickness of about 5 nm to about 100 nm. In various embodiments, the stack of inorganic layers can include about 2 to about 100 layers, or about 2 to 10, or about 2 to 5.

In one example embodiment, the functional layer 18 includes a plurality of inorganic layers, including metal or metal oxide layers, which may be the same or different, and may have the same or different thicknesses, separated by acrylate layers. In some embodiments, the acrylate layers in the functional layer 18 may be the same or different from the first acrylate layer 16 and the second acrylate layer 24 in the transfer article, may have the same or different thicknesses as the first acrylate layer 16 and the second acrylate layer 24.

In some embodiments, the functional layer 18 can include one or more optional barrier layers 25, 27 along the major surfaces 19, 21 thereof as shown schematically in FIG. 1, or on exposed surfaces of the inorganic layer 20, or both. The one or more barrier layers 25, 27 may include individual elemental metals, two or more metals as mixtures, inter-metallics or alloys, semi-metal or metalloids, metal oxides, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxy borides, metal and mixed metal silicides, diamond-like carbon, diamond-like glass, graphene, and combinations thereof.

In some embodiments, the barrier layers 25, 27 may be chosen from metal oxides, metal nitrides, metal oxy-nitrides, and metal alloys of oxides, nitrides and oxy-nitrides. In some embodiments, the barrier layers 15, 27 may include a metal oxide chosen from silicon oxides such as silica, aluminum oxides such as alumina, titanium oxides such as titania, indium oxides, tin oxides, indium tin oxide (ITO), hafnium oxide, tantalum oxide, zirconium oxide, zinc oxide, niobium oxide, and combinations thereof. In some embodiments, the metal oxides for the barrier layers 25, 27 may include aluminum oxide, silicon oxide, silicon aluminum oxide, aluminum-silicon-nitride, and aluminum-silicon-oxynitride, CuO, $TiO_2$, ITO, ZnO, aluminum zinc oxide, $ZrO_2$, and yttria-stabilized zirconia. Preferred nitrides may include $Si_3N_4$ and TiN.

In some example embodiments, the barrier layers 25, 27 can typically be prepared by reactive evaporation, reactive sputtering, chemical vapor deposition, plasma enhanced chemical vapor deposition, and atomic layer deposition. Preferred methods include vacuum preparations such as reactive sputtering and plasma enhanced chemical vapor deposition, and atomic layer deposition.

The barrier layers 25, 27 can be conveniently applied as a thin layer. The barrier layer material, e.g. silicon aluminum oxide, can for example, provide good barrier properties, as well as good interfacial adhesion to acrylate layers. Such layers are conveniently applied by sputtering, and a thickness between about 3 and 100 nm is considered convenient, with approximately 27 nm in thickness being considered particularly suitable. In some embodiments, the barrier layer may have a water vapor transmission rate of less than 0.2, 0.1, 0.05, 0.01, 0.005 or 0.001 g/m²/day, thus providing good environmental resistance for the inorganic layer 20.

The optional adhesive layer 22 on the transfer article 10 can include a viscoelastic or elastomeric adhesive with a low modulus of 50 MPa to about 1000 MPa. or about 100 MPa to about 500 MPa. Suitable viscoelastic or elastomeric adhesives can include those described in U.S. Pat. App. Pub. No. 2016/0016338 (Radcliffe et al.), for example, pressure-sensitive adhesives (PSAs), rubber-based adhesives (e.g., rubber, urethane) and silicone-based adhesives. Viscoelastic or elastomeric adhesives also include heat-activated adhesives which are non-tacky at room temperature but become temporarily tacky and are capable of bonding to a substrate at elevated temperatures. Heat activated adhesives are activated at an activation temperature and above this temperature have similar viscoelastic characteristics as PSAs. Viscoelastic or elastomeric adhesives may be substantially transparent and optically clear.

Any of the viscoelastic or elastomeric adhesives 22 may be viscoelastic optically clear adhesives. Elastomeric materials may have an elongation at break of greater than about 20 percent, or greater than about 50 percent, or greater than about 100 percent.

The viscoelastic or elastomeric adhesive layers 22 may be applied directly as a substantially 100 percent solids adhesive or may be formed by coating a solvent-borne adhesive and evaporating the solvent. Viscoelastic or elastomeric adhesives may be hot melt adhesives which may be melted, applied in the melted form and then cooled to form a viscoelastic or elastomeric adhesive layer. Suitable viscoelastic or elastomeric adhesives include elastomeric polyurethane or silicone adhesives and the viscoelastic optically clear adhesives CEF22, 817x, and 818x, all available from 3M Company, St. Paul, MN Other useful viscoelastic or elastomeric adhesives include PSAs based on styrene block copolymers, (meth)acrylic block copolymers, polyvinyl ethers, polyolefins, and poly(meth)acrylates. In some embodiments, the adhesive layer 22 can include a UV cured adhesive.

Figure 2:
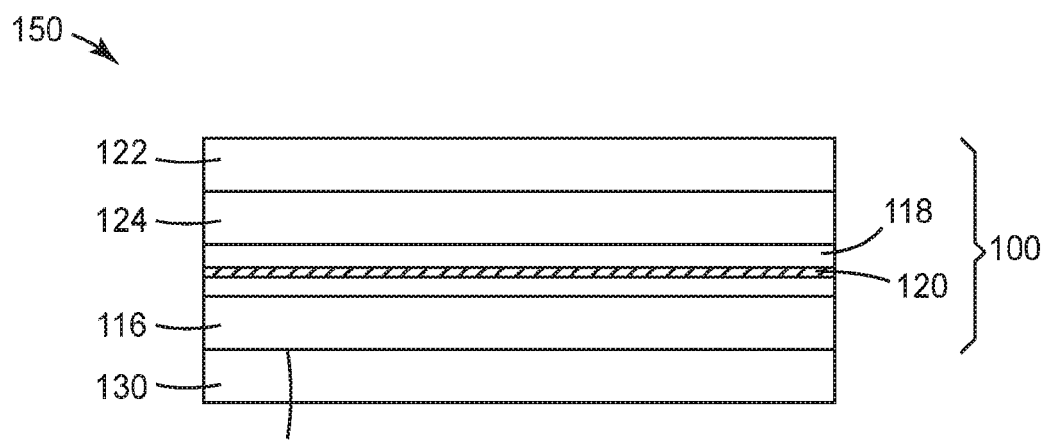
FIG. 2 is a schematic cross-sectional view of the transfer article of FIG. 1 on an adhesive layer.

Referring again to FIG. 1, the first acrylate layer 16 may be removed from the release layer 14 along the release surface 17. The resulting transfer article 100, which in the embodiment of FIG. 2 includes the first acrylate layer 116, the functional layer 118 with the at least one inorganic layer 120, the second acrylate layer 124, and the adhesive layer 122, forms a patternable construction 150 (FIG. 2). In some embodiments, a surface 121 of the first acrylate layer 116, which is air-facing following removal from the release layer 14, can be contacted with a tool to change the shape of the at least one inorganic layer 120. In some embodiments, depending on the materials and the thicknesses selected for the inorganic layer 120 in the functional layer 118, the first acrylate layer 116 may not be required to support the functional layer 118, and the functional layer 118 may be contacted with the tool to change the shape of the at least one inorganic layer 120. The relatively soft low modulus adhesive layer 122 underlying the first acrylate layer 116 (if present), or the functional layer 118, allows for lower pressures during the process of patterning the at least one inorganic layer 120.

In another embodiment, following the transfer the first acrylate layer 116 is applied on an intermediary substrate prior to the patterning step. For example, as shown in FIG. 2, the first acrylate layer may be applied to a low modulus layer 130 such that the first acrylate layer 116 contacts the low modulus layer 130 to create a patternable construction 150. The low modulus layer 130 can include any material with a modulus at of about 50 MPa to about 1000 MPa, or about 100 MPa to about 500 MPa. In some embodiments, the low modulus layer 130 is an adhesive layer, which in some embodiments may be a pressure sensitive adhesive, a bonding adhesive, and the like. In various embodiments, the low modulus layer 130 is an acrylic adhesive or an acrylic pressure sensitive adhesive.

In various embodiments, the article 150 of FIG. 2 may optionally include polymeric film layers on one or both of the adhesive layer 122 and the low modulus layer 130 (not shown in FIG. 2).

Figure 3:
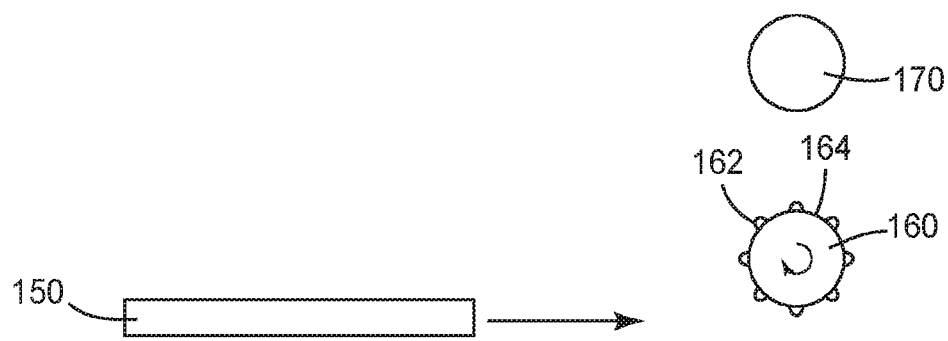
FIG. 3 is a schematic representation of a roll-to-roll patterning process suitable for patterning the articles of the present disclosure.

The patternable construction 150 of FIG. 2, with or without the low modulus layer 130, may be contacted with a tool to change the shape of at least one inorganic layer 120 in the functional layer 118 from a substantially flat surface to a shaped surface including areas that are raised, recessed, or combinations thereof, from the remainder of a plane of the surface. The patternable construction 150 may be contacted with the tool in using a wide variety of techniques including, for example, rotary embossing, single nip embossing, spot embossing, overall embossing, engraving, microembossing, and the like. In some embodiments, which are not intended to be limiting, the patternable construction 150 is contacted with a patterned nip roller, passed through serial nip rollers, or between parallel nip rollers in a roll-to-roll process. For example, as shown schematically in FIG. 3, the patternable construction 150 is passed between rollers 160 and 170. Projections 162 extending outward from a surface 164 on the roller 160 impact the first acrylate 116 or functional layer 118 and form recessed pattern elements in at least one inorganic layer 120 of the functional layer 118. The projections 162 in the example of FIG. 3 form female (recessed) pattern elements in the inorganic layer 120, but the roller 160 can also include depressions that form male (raised) pattern elements in the inorganic layer 120, or combinations thereof. In various embodiments, the rollers 160, 170 may be rigid materials such as steel, or compliant materials such as rubber or polymeric materials.

The shapes of the projections/depressions in the tool used to form the recessed or raised toolmarks in the inorganic layer 120 may vary widely. Suitable shapes include, but are not limited to, hemispheres, pyramids, cones, linear or circuitous ridges, square and rectangular blocks, and the like, and may be used to form a wide variety of pattern elements in the inorganic layer 120, which are referred to herein as toolmarks. The tool can be suitably configured to form a wide variety of toolmarks in the inorganic layer 120, including, for example, impressed marks, striation marks, cut marks, and mixtures and combinations thereof. The projections/depressions 162 may be arranged in a regular or an irregular array on the surface 164 of the tool 160, and likewise the toolmarks formed by the projections/depressions 162 may be located throughout the inorganic layer 120, or in specific regions of the inorganic layer 120, and some areas of the inorganic layer may be substantially flat and free of toolmarks.

Figure 4:
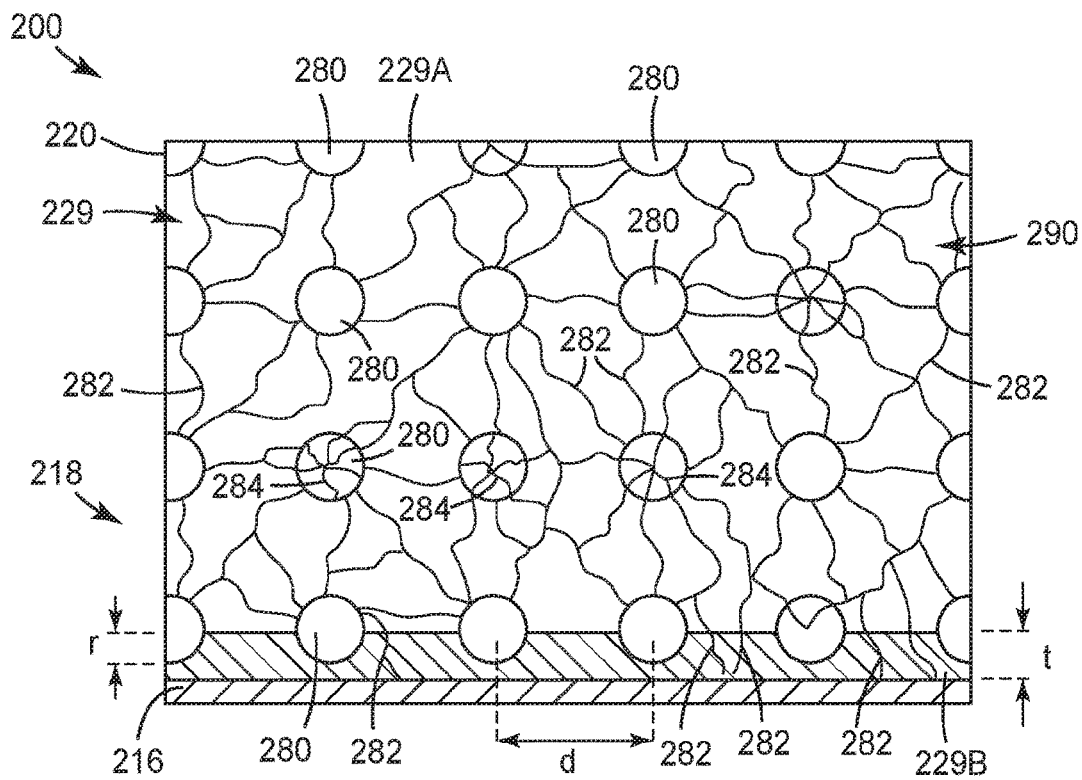
FIG. 4 is a schematic overhead view in perspective, which shows an embodiment of a patterned surface of an inorganic layer of an article of the present disclosure.

Referring now to FIG. 4, an embodiment of a transfer article 200 includes a first acrylate layer 216 underlying a functional layer 218 with a patterned inorganic layer 220 thereon (the other layers in the functional layer 218 are omitted for clarity). The inorganic layer 220, which includes a major surface 229, has a thickness t of about 1 nm to about 250 nm, or about 3 nm to about 200 nm, or about 5 nm to about 100 nm, or about 10 nm to about 50 nm. The patterned inorganic layer 220 has been processed by a tool to form in the surface 229 thereof a regular array of impressed recessed (female) toolmarks 280. The toolmarks have a hemispherical cross-sectional shape, and have an average center-to-center spacing d of less than about 500 microns, or less than about 250 microns, or less than about 150 microns, or less than about 100 microns. In various embodiments, the toolmarks 280 are present on the surface 229 at about 0.3 to about 2000 per $mm^2$, or about 1 to about 1000 per $mm^2$, or about 10 to about 500 per $mm^2$, or about 50 to about 100 per $mm^2$. In various example embodiments, the toolmarks 280 have a depth r below the surface 229 of about 5 microns to about 100 microns, or about 1 micron to about 10 microns, or about 1 micron to about 5 microns.

At least one factor such as, for example, the impact force of the tool forming the impressed marks 280, the proximity of the toolmarks to one another, the depth of the toolmarks, properties of the transfer article 200 such as, for example, the thickness of the inorganic layer 220, the thickness of the first acrylate layer 216, and the like, cause the surface 229 of the inorganic layer 220 to shatter and form an arrangement of microfractures or cracks 282. At least a portion, and in some cases substantially all, of the cracks 282 emanate from the toolmarks 280 and propagate between the toolmarks 280, thereby forming an array 290 in which the toolmarks 280 are interspersed with the cracks 282. In addition, the impact of the tool as the impressed toolmarks 280 are formed also creates cracks 284 within at least some of the toolmarks 280. The cracks 284 can also propagate outward from the toolmarks 280 and form new cracks or join with other cracks to form the array 290. In various embodiments, the cracks 282, 284 are present on the surface 229 of the inorganic layer 220 at about 0.3 to about 10000 per $mm^2$, or about 1 to about 5000 per $mm^2$, or about 10 to about 1000 per $mm^2$, or about 50 to about 500 per $mm^2$. As shown in FIG. 4, at least some, and in most cases a majority, of the cracks 282, 284 extend fully through the thickness of the inorganic layer 220 from a first major surface 229A to a second major surface 229B thereof, while other cracks 282 occupy regions on the first major surface 229A and extend only partway through the thickness of the inorganic layer 220 toward the second major surface 229B.

Figure 5:
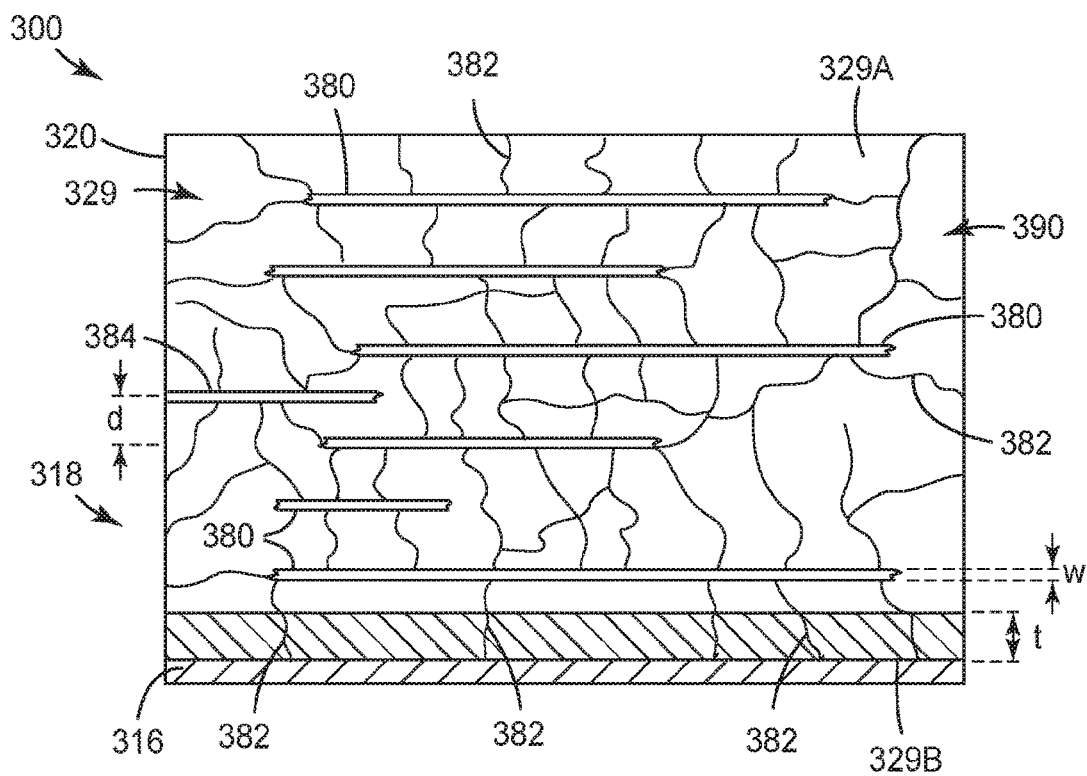
FIG. 5 is a schematic overhead view in perspective, which shows an embodiment of a patterned surface of an inorganic layer of an article of the present disclosure.

Referring to another example embodiment in FIG. 5, another embodiment of a transfer article 300 includes a first acrylate layer 316 underlying a functional layer 318 with a patterned inorganic layer 320 thereon (the other layers in the functional layer 318 are omitted for clarity). The inorganic layer 320, which includes a major surface 329, has a thickness t of about 1 nm to about 250 nm, or about 3 nm to about 200 nm, or about 5 nm to about 100 nm, or about 10 nm to about 50 nm. The inorganic layer 320 has been processed by a tool to form in the surface 329 thereof a regular array of impressed recessed (female) linear striation toolmarks 380. The striation toolmarks 380 have a rectangular cross-sectional shape, and have an average center-to-center spacing d of less than about 15 mm, or less than about 10 mm, or less than about 5 mm, or less than about 2 mm, or less than about 1 mm, or less than about 500 microns, or less than about 100 microns, or less than about 50 microns. In various embodiments, the toolmarks 380 are present on the surface 329 at about 50 to about 100 per $mm^2$. In various example embodiments, the toolmarks 380 have a depth below the surface 329 of about 0.5 microns to about 100 microns, or about 1 micron to about 10 microns, or about 1 micron to about 5 microns. In various embodiments, the toolmarks 380 have a width w of about 50 microns to about 200 microns, or about 20 microns to about 50 microns.

Factors such as, for example, the impact force of the tool forming the impressed marks 380, the proximity of the toolmarks to one another, the depth of the toolmarks, properties of the transfer article 300 such as, for example, the thickness of the inorganic layer 320, the thickness of the first acrylate layer 316, the thickness of the inorganic layer 320, and the like, cause the surface 329 of the inorganic layer 320 to shatter and form an arrangement of microfractures or cracks 382.

At least a portion, and in some cases substantially all, of the cracks 382 emanate from the toolmarks 380 and propagate between the toolmarks 380, thereby forming an array 390 in which the toolmarks 380 are interspersed with the cracks 382. In addition, the impact of the tool as the impressed toolmarks 380 are formed also creates cracks 384 within the bounds of at least some of the toolmarks 380. The cracks 384 can also propagate outward from the toolmarks 380 and form new cracks or join with other cracks to form the array 390. In various embodiments, the cracks 382 are present on the surface 329 of the inorganic layer 320 at about 0.3 to about 10000 per $mm^2$, or about 1 to about 5000 per $mm^2$, or about 10 to about 1000 per $mm^2$, or about 50 to about 500 per $mm^2$. As shown in FIG. 5, at least some, and in most cases a majority, of the cracks 382 extend fully through the thickness of the inorganic layer 320 from a first major surface 329A to a second major surface 329B thereof, while other cracks 382 occupy regions on the first major surface 329A and extend only partway through the thickness of the inorganic layer 320 toward the second major surface 329B.

Figure 6:
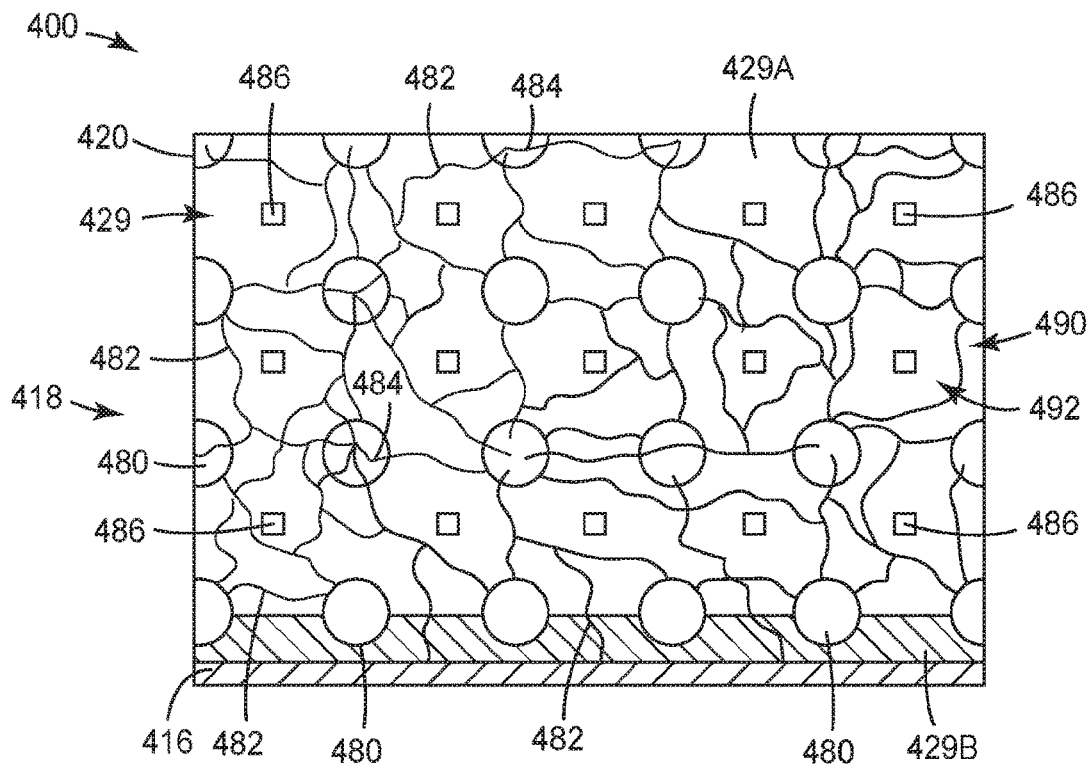
FIG. 6 is a schematic overhead view in perspective, which shows the patterned article of FIG. 4 with an additional macroscopic pattern applied thereto.

Referring now to FIG. 6, another embodiment of a transfer article 400 includes a first acrylate layer 416 underlying a functional layer 418 with a patterned inorganic layer 420 thereon (the other layers in the functional layer 418 are omitted for clarity). The inorganic layer 420 includes a major surface 429 that has been processed by a tool to form a regular array of impressed recessed (female) toolmarks 480. The toolmarks 480 have a hemispherical cross-sectional shape with an average center-to-center spacing of less than about 500 microns, or less than about 250 microns, or less than about 150 microns, or less than about 100 microns. In various embodiments, the toolmarks 480 are present on the surface 429 at about 0.3 to about 2000 per $mm^2$, or about 1 to about 1000 per $mm^2$, or about 10 to about 500 per $mm^2$, or about 50 to about 100 per $mm^2$. In various example embodiments, the toolmarks 480 have a depth below the surface 429 of about 0.5 microns to about 10 microns, or about 1 micron to about 10 microns, or about 1 micron to about 5 microns.

The striking of the tool that forms the impressed marks 480 causes the surface 429 of the inorganic layer 420 to shatter and form an arrangement of microfractures or cracks 482. At least a portion, and in some cases substantially all, of the cracks 482 emanate from the toolmarks 480 and propagate between the toolmarks 480, thereby forming an array 490 in which the toolmarks 480 are interspersed with the cracks 482. In addition, the impact of the tool as the impressed toolmarks 480 are formed also creates cracks 484 within at least some of the toolmarks 480. The cracks 484 can also propagate outward from the toolmarks 480 and form new cracks or join with other cracks to form the array 490. In various embodiments, the cracks 482 are present on the surface 429 of the inorganic layer 420 at about 0.3 to about 10000 per $mm^2$, or about 1 to about 5000 per $mm^2$, or about 10 to about 1000 per $mm^2$, or about 50 to about 500 per $mm^2$. As shown in FIG. 6, at least some, and in most cases a majority, of the cracks 482 extend fully through the thickness of the inorganic layer 420 from a first major surface 429A to a second major surface 429B thereof, while other cracks 482 occupy regions on the first major surface 429A and extend only partway through the thickness of the inorganic layer 420 toward the second major surface 429B.

In the embodiment of FIG. 6, the patterned inorganic layer 420 has been struck a second time by the same or a different tool to form a second array 492 of impressed toolmarks 486 superimposed on the first array 490 resulting from the first strike of the tool. In general, the second array of superimposed toolmarks 492 have a period of less than about 2000 microns, or less than about 1000 microns, or less than about 750 microns, can have a wide variety of cross-sectional shapes including, but are not limited to, hemispheres, pyramids, cones, linear or circuitous ridges, square and rectangular blocks, and the like. The second array of toolmarks 492 may have a wide variety of applications, and in some embodiments can be used to impose a macropattern on the surface 429 of the inorganic layer 420 that can alter the visual or electrical characteristics of the surface 429. For example, the second array of toolmarks 492 can viewed by an observer as an aesthetic design such as a logo or a pattern, can provide a matte finish to all or a portion of the surface 429, can vary the surface reflectivity of the inorganic layer 420 in selected areas or at selected viewing angles, can alter the surface scattering caused by the inorganic layer 420 in selected areas or at selected viewing angles, or can be used to alter the magnetic or electrical characteristics of the inorganic layer 420.

Figure 7:
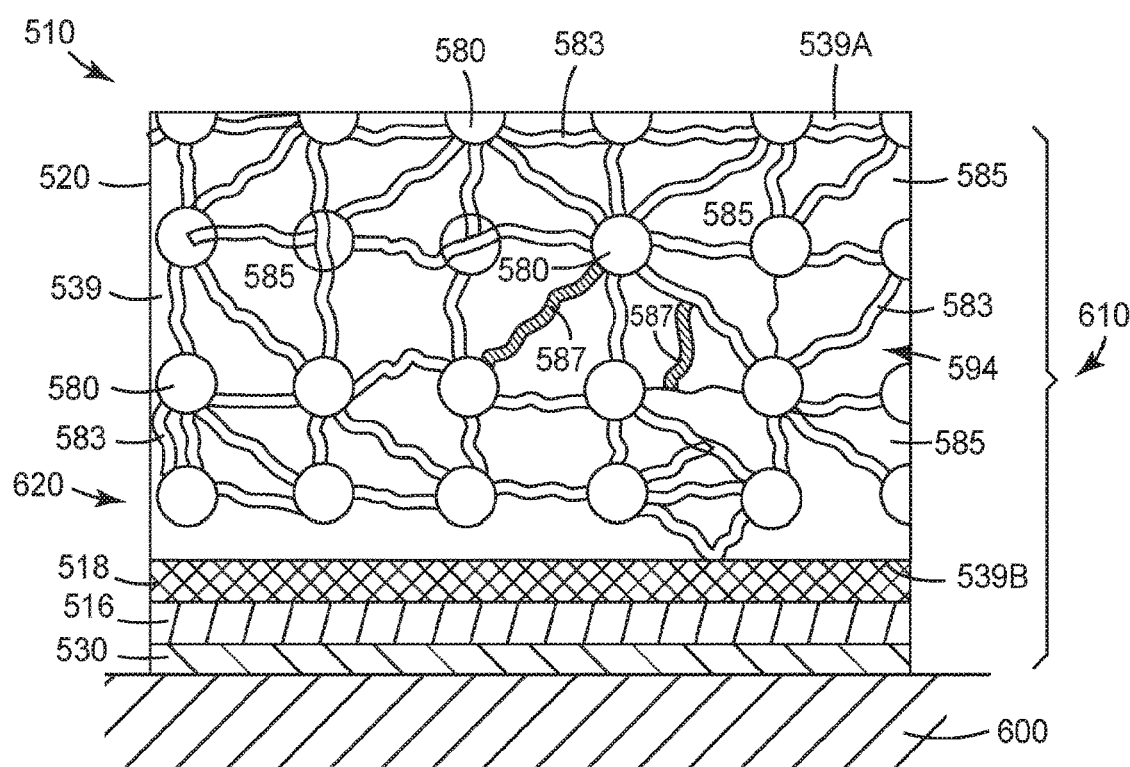
FIG. 7 is a schematic overhead view in perspective, which shows an embodiment of a laminate including the patterned article of FIG. 4.

Referring now to FIG. 7, a portion of a transfer article 510 is shown that is attached to a surface of interest 600 to form a laminate construction 610. The transfer article 510 includes an adhesive layer 530 on the surface 600, as well as a first acrylate layer 516 and a functional layer 518 including at least one inorganic layer 520. The transfer article 510 may also include other layers such as a second acrylate layer, adhesive layers, and the like (see FIG. 1, for example), which are omitted from FIG. 7 for clarity. The inorganic layer includes a patterned surface 539 with an array of impressed toolmarks 580 interspersed with crevasses 583. When the transfer article 510 is stretched in at least one dimension prior to application to the surface 600, particularly if the transfer article is applied on a surface 600 with edges or a compound curvature (not shown in FIG. 7), the cracks between the toolmarks 580 expand and widen to form the crevasses 583 and create a microcracked inorganic layer 594. In various embodiments, the crevasses 583 have an average width of about 1 micron to about 50 microns, or about 10 microns to about 40 microns, or about 1 micron to about 10 microns, depending on the degree of stretching during the application process.

The crevasses 583 are separated by randomly shaped flakes 585. In various embodiments, the flakes 585 have a caliper or Feret diameter of less than about 500 microns, or less than about 200 microns, or less than about 100 microns. In the present application the term Feret diameter refers to the common basis of a group of diameters derived from the distance of two tangents to the contour of the particle in a well-defined orientation. For example, the Feret diameter is defined as the distance between two parallel tangents of the particle at an arbitrary angle.

The flakes 585 move between the crevasses 583, and at least a portion of the flakes 585 are forced out of a plane 620 occupied by the inorganic layer 520, exposing edges 587 thereof. In some embodiments, the crevasses 583 extend through the full thickness of the inorganic layer 520 from a first major surface 539A to a second major surface 539B thereof. In some embodiments, the exposed edges 587 of the flakes 585 of inorganic material can provide useful aesthetic or functional effects for the microcracked inorganic layer 594.

In one example, if the microcracked inorganic layer 594 includes metal or metal oxide layers, the exposed edges 587 can expose a portion of the inorganic layer 520 to provide the laminate article 610 with an enhancement of at least one of an anti-microbial, an antibacterial, or an anti-biofilm, effect A wide variety of meal oxides MOx may be used in such an application, as long as the layer 520 exhibits at least a 1-log microbial reduction, at least a 2-log reduction, at least a 3-log reduction, or at least a 4-log reduction, against *S. aureus* and *S. mutans* following 24 hour contact. Log reductions are measured after testing according to ISO test method ISO 22196:2011, "Measurement of antibacterial activity on plastics and other non-porous surfaces," with appropriate modifications of the test method to accommodate the test materials.

Suitable antimicrobial metals and metal oxides for the inorganic layer 520 include, but are not limited to, silver, silver oxide, copper oxide, gold oxide, zinc oxide, magnesium oxide, titanium oxide, chromium oxide, and mixtures, alloys and combinations thereof. In some embodiments, which are not intended to be limiting, the metal oxide in the inorganic layer 520 is chosen from AgCuZnOx, Ag doped ZnOx, Ag doped ZnO, Ag doped $TiO_2$, Al doped ZnO, and TiOx.

The inorganic layer 520 can include any antimicrobially effective amount of a metal, a metal oxide MOx, or mixtures and combinations thereof. In various embodiments, which are not intended to be limiting, the metal oxide layer 520 can include less than 100 mg, less than 40 mg, less than 20 mg, or less than 5 mg MOx per 100 $cm^2$.

In another embodiment, the crevasses 583 between the flakes 585 can provide the inorganic layer 520 with suitable dielectric properties to be transmissive to electromagnetic signals over a selected frequency range, which can be useful in 5G communication devices. For example, if the microfractured inorganic layer 520 has a tan δ of 0.12 when measured in a cavity of a split post dielectric resonator at 9.5 GHz as set forth in IPC Standard TM-650 2.5.5.13, the layer 520 can be more transparent to communication signals transmitted between mobile devices as compared to their non-microfractured state. In some embodiments, the microfractured inorganic layer 520 can have a real permittivity of about 33, and a complex permittivity of about 4.

In another example, the crevasses 583 and the flakes 585 can be selected to provide transparency for near infrared signals, which can enable the formation of highly conformable near-IR sensor cover construction on a surface.

In another example, the crevasses 583 and the flakes 585 can be selected to provide reflectivity for near infrared signals and transparency for visible light. For example, such a configuration can form a highly conformable visible light sensor cover.

In other examples, the edges of the flakes 585 can, when exposed, provide useful color changing, reflective, transmissive, or other aesthetic effects for the inorganic layer 520, which can provide a useful decorative film that may be applied to complex or compound surfaces such as, for example, vehicle exteriors or interiors. For example, in some embodiments, the transfer article 510 is reflective at visible wavelengths from 400-750 nm and at least partially transparent at wavelengths of greater than about 830 nm.

For example, when exposed to ambient conditions, some flakes 585 oxidize overtime, and this detectable color change can be used to evaluate, for example, a shelf life of a product. If the color change is not desirable, one or both surfaces of the metal layer including the flakes 585 can be overlain by one or more protective barrier layers of, for example, a metal oxide. In another example, the metal layers can be configured such that the flakes 585 provide a color-changing effect when exposed to light over a selected wavelength range such as, for example, when the article is stretched in two or three dimensions over a surface with compound curvature, The devices of the present disclosure will now be further described in the following non-limiting examples.

EXAMPLES

The following examples are for illustrative purposes and are not meant to be limiting to the scope of the appended claims. All parts, percentages, ratios, etc. in the example and the rest of the specification are by weight, unless noted otherwise.

Sigma-Aldrich Company, St. Louis, MO), NaCl (0.381 g/L), $CaCl_2.2H_2O$ (0.213 g/L), $KH_2PO_4$, (0.738 g/L), and KCl (1.114 g/L).

Bacteria inoculum (159 microliters) with a target concentration of $1 \times 10^6$ colony forming units/mL (cfu/mL) was spread over the micro-embossed surface of the article of Example 1 and incubated for 24 hours at 37° C. As a comparative example, a coupon with a non-micro-embossed surface was treated with the inoculum (Comparative Example A). After incubation, coupon samples were neutralized in Dey\Engley neutralizing broth neutralizing broth (obtained from Becton Dickinson Company, Franklin Lakes, NJ) and accessed for viable cell count using a plate count culture method. For the plate count culture method, viable bacteria were enumerated by performing 10-fold serial dilutions of the neutralizing broth (1 mL) in Butterfield's buffer (obtained from the 3M company). An aliquot of each dilution (100 microliters) was spread-plated onto a Tryptic Soy Agar plate (obtained from Hardy Diagnostics, Santa Maria,

TABLE 1

Materials and Sources

| Abbreviation | Description |
| --- | --- |
| SV480 | 3M ENVISION Print Wrap Film SV480mc, a on PVC print wrap film (0.0508 mm), was obtained from the 3M Company, Saint Paul, MN. |
| 8518 | Transparent PVC film with an adhesive coating was obtained from the 3M Company as 3M 8518 SCOTCHCAL Gloss Overlaminate, a transparent PVC film with an adhesive coating, was obtained from the 3M Company. |
| OCA | 3M Optically Clear Adhesive 8171, an acrylic-based adhesive (0.0250 mm thick), was obtained from the 3M Company. |
| PETG | Uncoated, clear polyethylene terephthalate glycol (0.75 mm thick) film was obtained from PACUR, LLC (Oshkosh, WI). |
| MicroEmbossTool 1 | 3M SCOTCHLITE Reflective Material - 8987 Fluorescent Lime-Yellow Flame Resistant Fabric, a bead-based retroreflective surface, was obtained from the 3M Company and used as the micro-embossing surface. The surface contained a distributed layer of randomly closed packed <100 micron glass beads. |
| MicroEmbossTool 2 | 3M Brightness Enhancement Film (3M BEF2-T-155n-Auto), having a linear prism film structure, was obtained from the 3M Company and used as the micro-embossing surface. The surface was made of linear prismatic structures at 90 degrees with a 50 micron pitch. |
| MicroEmbossTool 3 | 3M High Intensity Prismatic Reflective Sheeting Series 3930 was obtained from the 3M Company and used as the micro-embossing surface. The reflective sheet was a micro structured surface that was composed of a precision array of cube corners. There were alternating 0.9 cm wide lines of <100 micron wide cube-corners with a rotated in-plane hexagonal orientation. |
| MicroEmbossTool 4 | A micro-embossed paper liner Apex 925 was obtained from Sappi Limited (Westbrook, ME) and used as the micro-embossing surface. Apex 925 had raised rough-surface hexagonal features (about 150 microns wide) spaced by about 50 microns. |
| MicroEmbossTool 5 | An abrasive 3M Trizact P3000 film was obtained from the 3M Company and used as the micro-embossing surface. The abrasive surface was micro structured and was composed of a precision array of elongated prisms that were <50 microns wide and <300 microns in length, spaced by 50 micron gaps. |

Test Methods

Antimicrobial Kill Properties Test

Modified ISO 22196:2011 method 'Measurement of Antibacterial Activity on Plastic and Other Non-Porous Surfaces' was used for evaluating the antibacterial properties of articles of the Examples. Test samples were cut into square coupons (1 inch (2.54 cm) by 1 inch (2.54 cm), n=2). An inoculum of *Streptococcus mutans* (ATCC 27352) was prepared in phosphate buffer and artificial saliva. The composition of the artificial saliva was prepared as follows: mucin from porcine stomach type III (2.2 g/L, obtained from the CA). The plates were incubated for 48 hours under anaerobic conditions at 37° C. After incubation, colonies were manually counted.

Tarnish Test

Tarnish testing media was an acidic solution (pH 3.7) containing ketchup (6.25 g), mustard (6.25 g), and water (87.5 g). Each sample strip [3 inches (7.62 mm) long by 1 inch (2.54 cm) wide] was soaked in the acidic solution for either 1, 5, 10 or 60 minutes. After each soak period, the test strips were removed from the tarnish test media, thoroughly rinsed with deionized water and visually examined for color difference.

Accelerated Weathering Test

Standard laboratory water was heated to 95° C. and articles were submerged for 24 hours. Following submersion, the articles were examined for discoloration by visual examination under ambient lighting.

Microfracture Confirmation Test

A VHX-6000 series Keyence digital microscope with a 100× objective lens (Keyence Corporation of America, Itasca, IL) was used in visible light transmission mode to view light leakage from fractures in the film article. Fractures were visible as higher visible light transmission regions surrounded by the lower visible light transmission non-fractured surfaces.

Microfracture Fracture Density Test

A VHX-6000 series Keyence digital microscope with a 100× objective lens (Keyence Corporation of America, Itasca, IL) was used in visible light transmission mode to view light leakage from fractures in the film article. Fractures were visible as higher visible light transmission regions surrounded by the lower visible light transmission non-fractured surfaces. Microscope images were analyzed using the "Particle Counting" feature in Image J v1.52a (National Institute of Health, USA). The fracture density was calculated by dividing the total number of fractures for a given image by the square area of the image.

NIR/Visible Scattering Ratios Test

The samples were characterized using an Ultrascan Pro spectrophotometer (Hunter Associates Laboratory, Reston, VA). The visible and near-infrared (NIR) transmission of the samples was measured in 5 nm increments from 350 to 1050 nm, with 850 nm and 940 nm being the two regions of primary interest. The total and diffuse transmission was measured, and the spectral transmission was calculated as the difference between the two. The scattering ratio was defined as the ratio of diffuse transmission to total transmission.

5G Spectrum Transmission Measurement (60-90 GHz Transmission Spectra Data Test Apparatus)

A free-space measurement system designed and built by Thomas Keating Ltd. (Billingshurst, UK) was used. The free space system was combined with a N5290A 900 Hz to 110 GHz PNA MM-Wave Keysight VNA (Vector Network Analyzer) and analysis software to provide a power measurement tool for the determination of complex material properties, including Transmission of Power through a material at 0 degrees incidence. The Thomas Keating System used was a 60-90 GHz Quasi-Optic system. The Keysight VNA hardware was a "zero gain" circuit whereby a Gaussian beam waist at the aperture of a corrugated feed horn (Port Si) was refocused by an ellipsoidal mirror to form a beam waist at the sample position and then passed, via a second mirror, to the S2 Port, where a second corrugated feed horn fed the beam into the VNA waveguide. For the measurements, the N5290A PNA MM Wave System that operated from a frequency range of 60 GHz to 90 GHz was used. The Transmission measurements were directly measured with the Vector Network analyzer, as the normalized power associated with the Complex S-Parameter S12.

9.5 GHz Split Post Dielectric Resonator Tan Delta (Tan δ) Measurement

A 9.5 GHz Split Post Dielectric Resonator (SPDR) with an 0.85 mm air-gap cavity was used as per IPC Standard TM-650 2.5.5.13. In the standard SPDR setup, the 9.5 GHz Tan Delta material property, which is the ratio of the imaginary part of the complex permittivity to the real part of the complex permittivity, was obtained by inserting an example article in the SPDR air cavity and measuring changes in the cavity resonance center frequency and measuring changes in the resonance frequency band width. The maximum measurable 9.5 GHz Tan Delta with this SPDR measurement technique was a value of 0.12 for the thickness of sample we tested (<0.85 mm cavity width). The Preparative Examples 1, 2, and 3 were all had a maximum measurable 9.5 GHz Tan Delta>0.12 (outside of the detection limit) before transferring. After transferring, the maximum measurable 9.5 GHz Tan Delta of the transfer stack in Preparative Example 3 was >0.12 (outside the detection limit).

Preparative Example 1. Ag Coated Transfer Stack

The transfer film of this Example was made on a roll to roll vacuum coater similar to the coater described in U.S. Patent Application No. 20100316852 (Condo, et al.) with the addition of a second evaporator and curing system located between the plasma pretreatment station and the first sputtering system, and using evaporators as described in U.S. Pat. No. 8,658,248 (Anderson and Ramos). The coater was threaded up with an indefinite length roll (980 micro-inch (0.0250 mm) thick, 14 inch (35.6 cm) wide) of an aluminized biaxially-oriented polypropylene film release layer (obtained under the trade designation TORAYFAN PMX2 from Toray Plastics (America), North Kingstown, RI). The release layer was then advanced at a constant line speed of 32 fpm (9.8 meters/minute).

A first acrylate layer, tricyclodecane dimethanol diacrylate (obtained under the trade designation SARTOMER SR833S from Sartomer USA, Exton, PA) was applied to the release layer by ultrasonic atomization and flash evaporation to make a coating width of 12.5 inches (31.8 cm). The flow of liquid monomer into the evaporator was 0.67 mL/minute. The nitrogen gas flow rate was 100 standard cubic centimeters per minute (sccm) and the evaporator temperature was set at 500° F. (260° C.). The process drum temperature was 14° F. (−10° C.). This monomeric coating was subsequently cured immediately downstream with an electron beam curing gun operating at 7.0 kV and 10.0 mA to result in a 180 nm thick acrylate layer.

On top of the first acrylate layer, a silver reflector layer was deposited by direct current (DC) sputtering of a >99% silver cathode target. The system was operated at 3 kW with a 30 fpm (9.1 meters per minute) line speed. Two subsequent depositions with the same power and line-speed were done to create a 90 nm layer of silver.

On top of the silver layer, an oxide layer of silicon aluminum oxide was deposited by alternating current (AC) reactive sputtering. The cathode had a Si(90%)/Al (10%) target and was obtained from Soleras Advanced Coatings US (Biddeford, ME). The voltage for the cathode during sputtering was controlled by a feed-back control loop that monitored the voltage and controlled the oxygen flow. The system was operated at 32 kW of power to deposit a 12 nm thick layer of silicon aluminum oxide onto the silver reflector.

Preparative Example 2. Oxide/Ag Coated Transfer Stack

The transfer film of this Example was made as in Preparative Example 1 except the order of the deposition of the silver layer and the oxide layer was reversed.

Preparative Example 3. Al-Based Metal-Insulator-Metal (MIM) Transfer Stack

The release layer with coated first acrylate layer was prepared according to the procedure described in the first part of Preparative Example 1. On the top of the first acrylate layer, an aluminum reflector layer was deposited. A conventional DC sputtering process employing argon gas and operated at 2 kW of power was employed to deposit a 60 nm thick layer of Al. The cathode Al target was obtained from ACI Alloys (San Jose, CA).

On top of the reflective Al layer, a second acrylate layer was applied. The second acrylate layer was produced from a monomer solution by atomization and evaporation of SARTOMER SR833S+3% CN 147 (obtained from Sartomer USA, Exton, PA). The second acrylate layer was applied using a flow rate of the mixture into the atomizer of 0.67 mL/min; a gas flow rate of 60 sccm, and an evaporator temperature of 260° C. Once condensed onto the Al layer, the coated acrylate was cured with an electron beam operating at 7 kV and 10 mA to provide a 290 nm thick layer. This second acrylate layer provided the insulating layer of the functional metal-insulator-metal (MIM) transfer stack.

On top of the second acrylate layer, a second Al reflective layer was deposited in a similar manner as the first reflective layer. A conventional DC sputtering process employing argon gas and operated at 2 kW of power was used to deposit an 8 nm thick layer of Al.

The accelerated weathering test on this preparative example showed visible discoloration.

Preparative Example 4. Weather-Resistant Al-Based MIM Transfer Stack

The release layer with coated first acrylate layer was prepared according to the procedure described in the first part of Preparative Example 1. On the top of the first acrylate layer, an aluminum reflector layer was deposited. A conventional DC sputtering process employing argon gas and operated at 2 kW of power was employed to deposit a 60 nm thick layer of Al. The cathode Al target was obtained from ACI Alloys (San Jose, CA).

On top of the reflective Al layer, a second acrylate layer was applied. The second acrylate layer was produced from a monomer solution by atomization and evaporation of SARTOMER SR833S+3% CN 147 (obtained from Sartomer USA, Exton, PA). The acrylate layer was applied using a flow rate of the mixture into the atomizer of 0.67 mL/min; a gas flow rate of 60 sccm, and an evaporator temperature of 260° C. Once condensed onto the Al layer, the coated acrylate was cured with an electron beam operating at 7 kV and 10 mA to provide a 290 nm thick layer. This second acrylate layer provided the insulating layer of the functional metal-insulator-metal (MIM) transfer stack.

On top of the second acrylate layer, a first inorganic barrier layer was applied. The oxide material of the barrier layer was applied by an AC reactive sputter deposition process employing a 40 kHz AC power supply. The cathode had a Si(90%)/Al(10%) rotary target and was obtained from Soleras Advanced Coatings US. The voltage for the cathode during sputtering was controlled by a feed-back control loop that monitored the voltage and controlled the oxygen flow. The system was operated at 16 kW of power to deposit a 12 nm thick layer of silicon aluminum oxide onto second acrylate layer.

On top of the first inorganic barrier layer, a second reflective layer was deposited in a similar manner as the first reflective layer. A conventional DC sputtering process employing argon gas and operated at 2 kW of power was employed to deposit the second reflective layer as an 8 nm thick layer of Al.

On top of the second reflective layer, a second inorganic barrier layer was applied in the same manner as the first inorganic barrier layer.

A third acrylate layer was deposited on top of the second inorganic barrier layer. This layer was produced from monomer solution by atomization and evaporation of SARTOMER SR833S+6% Dynasilan 1189 (obtained from Evonik Industries, Essen, DE). The flow rate of this mixture into the atomizer was 0.67 mL/minute. The gas flow rate was 60 sccm, and the evaporator temperature was 260° C. Once condensed onto the second inorganic barrier layer, the coated acrylate was cured with an electron beam operating at 7 kV and 10 mA to provide a 290 nm thick layer. The accelerated weathering test on this preparative example showed no visible discoloration in the MIM transfer stack.

Preparative Example 5. Visible Reflector NIR Transmissive Transfer Stack

The transfer film described in this Example and was made on a roll to roll vacuum coater similar to the coater described in U.S. Patent Application No. 20100316852 (Condo, et al.) with the addition of a second evaporator and curing system located between the plasma pretreatment station and the first sputtering system, and using evaporators as described in U.S. Pat. No. 8,658,248 (Anderson and Ramos). The coater was outfitted with a substrate in the form of a 1000 ft length roll of 0.178 mm thick, 14 inch (35.6 cm) wide polyethylene terephthalate (PET) film (obtained under the trade designation MELINEX ST504 from DuPont Teijin Films, Chester, VA). The film was treated with a nitrogen plasma operating at 20 W using a titanium cathode, using a web speed of 3.0 meters/minute and maintaining the backside of the film in contact with a coating drum chilled to 0° C.

On the plasma treated PET substrate surface, a release layer of SiAl was deposited in-line with the previous plasma treatment step. A conventional AC sputtering process employing Ar gas and operated at 16 kW of power was used to deposit a 74 nm thick layer of SiAl alloy onto the substrate. The cathode had a Si(90%)/Al(10%) target and was obtained from Soleras Advanced Coatings US.

On top of the SiAl release layer, a first acrylate layer of tricyclodecane dimethanol diacrylate (obtained under the trade designation SARTOMER SR833S from Sartomer USA, Exton, PA) was deposited in-line. The acrylate layer was applied by ultrasonic atomization and flash evaporation to make a coating width of 12.5 inches (31.8 cm). The first acrylate layer was applied using a flow rate into the atomizer of 0.4 mL/minute; a gas flow rate of 60 sccm, and an evaporator temperature of 260° C. Once condensed onto the SiAl layer, this monomeric coating was cured immediately with an electron beam curing gun operating at 7.0 kV and 10.0 mA to provide a 55 nm thick layer.

On top of the first acrylate layer, a first inorganic oxide layer of niobium oxide (NbOx) was applied in a separate pass. A conventional DC sputtering process operated at 2 kW of power was employed to deposit an approximately 66 nm thick layer of NbOx onto the substrate at a line speed of 1.95 fpm (0.59 meters/minute) using a 450 sccm argon and 14 sccm oxygen gas flow. The cathode had a suboxide NbOx target that was obtained from Soleras Advanced Coatings US.

On top of the first niobium oxide layer, a second inorganic oxide layer of silicon aluminum oxide (SiAlOx) was applied. The cathode had a Si(90%)/Al(10%) target and was obtained from Soleras Advanced Coatings US, of Biddeford, (ME). A conventional AC sputtering process employing argon and oxygen gas at 22 kW of power was used to deposit a 91 nm thick layer of SiAlOx oxide onto the niobium oxide layer at a line speed of 4.71 fpm (1.43 meters/minute).

On top of the second inorganic layer, a third inorganic oxide layer of NbOx was applied in a separate pass in the same manner as the first inorganic niobium oxide layer (line speed of 1.95 fpm (0.59 meters/minute) using a 450 sccm argon and 14 sccm oxygen gas flow) to deposit an approximately 66 nm thick layer of NbOx.

Comparative Example A. Transfer-Based Non-Embossed Article

PETG film was heated to 100° C. on a hot plate and the oxide surface of the transfer stack of Preparative Example 1 was laminated to the hot PETG surface. The TORAYFAN PMX2 liner was discarded leaving an air-facing (first acrylate layer out) transfer stack on the PETG surface. The "Microfracture Confirmation Test" confirmed that no microfractures were present in the surface of the article tested by the "Antimicrobial Kill Properties Test". Antimicrobial performance of the silver-containing transfer stack article was measured according to the test method "Antimicrobial Kill Properties Test". The measured viable cell count was $1 \times 10^6$ cfu/cm$^2$.

Example 1. Transfer-Based Micro Embossed Article

PETG film was heated to 100° C. on a hot plate and the oxide surface of the transfer stack of Preparative Example 1 was laminated to the hot PETG surface. The TORAYFAN PMX2 release liner was removed leaving an air-facing (first acrylate layer out) transfer stack on the PETG surface. The first acrylic layer was micro-embossed with a linear sharp steel razor edge to induce fracture in the silver-containing transfer stack at intervals of 1 cm. The "Microfracture Confirmation Test" confirmed that microfractures were present in the surface of the article tested by the "Antimicrobial Kill Properties Test". The antimicrobial performance of the micro-embossed silver-containing transfer stack article was measured according to the test method "Antimicrobial Kill Properties Test". The measured viable cell count was $1 \times 10^{1.8}$ cfu/cm$^2$.

Example 2. Transfer-Based Micro Embossed Article

PETG film was heated to 100° C. on a hot plate and the oxide surface of the transfer stack of Preparative Example 2 was laminated to the hot PETG surface. The TORAYFAN PMX2 release liner was removed leaving an air-facing (first acrylate layer out) transfer stack on the PETG surface. The first acrylic layer was micro-embossed with a linear sharp steel razor edge to induce fracture in the silver-containing transfer stack at intervals of 1 cm. The "Tarnish Test" was conducted on the micro-embossed silver-containing transfer stack article surface and no discernible discoloration was observed.

Comparative Example B. Transfer-Based Non-Embossed Article

The adhesive surface of 8518 film was laminated to the second reflective layer surface of the transfer stack of Preparative Example 3. The TORAYFAN PMX2 release liner was removed leaving an air-facing (first acrylate layer out) transfer stack on the 8518 film surface. SV480 film was then laminated with a hand roller to the air-facing first acrylate layer. The "5G Spectrum Transmission Measurement" indicated a 26 dB Transmission loss. The "Microfracture Confirmation Test" confirmed microfractures were not present in the surface tested.

The full construction was then uniaxially stretched by hand to 30% elongation in the machine direction. Stretching broke the brittle transfer-stack construction into discrete flakes with dimensions on the order of 500 microns (as measured using a digital Keyence VHX-6000 microscope equipped with a built-in software measurement tool). These large discrete flakes were discernable by visual examination under ambient light conditions at a viewing distance of 10 cm from the sample surface.

Example 3. Transfer-Based Micro Embossed Article

The adhesive surface of 8518 film was laminated to the second reflective layer surface of the transfer stack of Preparative Example 3. The TORAYFAN PMX2 release liner was removed leaving an air-facing (first acrylate layer out) transfer stack on the 8518 film surface.

The first acrylate layer was micro-embossed with a steel roller backed MicroEmbossTool1 and was backed by a 68 Shore A rubber laminator using 90 pounds per linear nip lamination force to micro-emboss the surface. The micro-embossing tool film was discarded. The "Microfracture Confirmation Test" confirmed that microfractures were present in the surface tested. The "Microfracture Fracture Density Test" showed 72 cracks/mm$^2$. The average crevasse width was 15 microns.

SV480 film was laminated to the air-facing first acrylate layer. The full construction was uniaxially stretched in the machine direction by hand to 30% elongation. Stretching broke the brittle transfer-stack construction by initiating further fracture from the indicated microfractures into discrete flakes having Feret diameters of less than about 200 microns in the stretched direction (as measured using a digital Keyence VHX-6000 microscope equipped with a built-in software measurement tool). These smaller discrete flakes were not discernable by visual examination under ambient light conditions at a viewing distance of 10 cm from the sample surface.

Example 4. Transfer-Based Micro Embossed Article

The adhesive surface of 8518 film was laminated to the second reflective layer surface of the transfer stack of Preparative Example 3. The TORAYFAN PMX2 release liner was removed leaving an air-facing (first acrylate layer out) transfer stack on the 8518 film surface.

The first acrylate layer was micro-embossed with a steel roller backed MicroEmbossTool2 and was backed by a 68 Shore A rubber laminator using 90 pounds per linear nip lamination force to micro-emboss the surface. The micro-embossing tool film was discarded. The "Microfracture Confirmation Test" confirmed that microfractures were present in the surface tested.

The SV480 film was laminated to the air-facing first acrylate layer. The full construction was uniaxially stretched by hand to 30% elongation along the direction of the fracture lines. Stretching broke the brittle transfer-stack construction into discrete flakes with Feret diameters along the stretch direction into sizes on the order of 500 microns (as measured using a digital VHX-6000 microscope with a built-in software measurement tool). These large discrete flakes were discernable by visual examination under ambient light conditions at a viewing distance of 10 cm from the sample surface.

Example 5. Transfer-Based Micro Embossed Article. The adhesive surface of 8518 film was laminated to the second reflective layer surface of the transfer stack of Preparative Example 3. The TORAYFAN PMX2 release liner was removed leaving an air-facing (first acrylate layer out) transfer stack on the 8518 film surface.

The first acrylate layer was micro-embossed with a steel roller backed MicroEmbossTool2 and was backed by a 68 Shore A rubber laminator using 90 pounds per linear nip lamination force to micro-emboss the surface. The micro-embossing tool film was discarded. The "Microfracture Confirmation Test" confirmed that microfractures were present in the surface tested.

SV480 film was laminated to the air-facing first acrylate layer. The full construction was uniaxially stretched by hand to 30% elongation perpendicular to the direction of the fracture lines. Stretching broke the brittle transfer-stack construction into discrete flakes with Feret diameters along the stretch direction into sizes on the order of 200 microns (as measured using a digital Keyence VHX-6000 microscope equipped with a built-in software measurement tool). These smaller lateral-dimensioned discrete flakes were not discernable by visual examination under ambient light conditions at a viewing distance of 10 cm from the sample surface.

Example 6. Transfer-Based Micro Embossed Article

The adhesive surface of 8518 film was laminated to the second reflective layer surface of the transfer stack of Preparative Example 3. The TORAYFAN PMX2 release liner was removed leaving an air-facing (first acrylate layer out) transfer stack on the 8518 film surface. The 9.5 GHz Split Post Dielectric Resonator Tan Delta Measurement was determined to be outside the detection limit (>0.12).

The first acrylate layer was micro-embossed with a steel roller backed MicroEmbossTool3 and was backed by a 68 Shore A rubber laminator using 90 pounds per linear nip lamination force to micro-emboss the surface. The micro-embossing tool film was discarded. The "Microfracture Confirmation Test" confirmed that microfractures were present in the surface tested.

The 9.5 GHz Split Post Dielectric Resonator Tan Delta Measurement was determined to be 0.115. SV480 film was then laminated to the air-facing first acrylate layer. The "5G Spectrum Transmission Measurement" indicated a 9 dB Transmission loss.

The full construction was then stretched by hand to 30% elongation. Stretching broke the brittle transfer-stack construction into discrete flakes with Feret diameters along the stretch direction into sizes on the order of 200 microns (as measured using a digital Keyence VHX-6000 microscope equipped with a built-in software measurement tool). These smaller discrete flakes were not discernable by visual examination under ambient light conditions at a viewing distance of 10 cm from the sample surface. The 0.9 cm wide lanes of alternating orientation of the cube corners were visible and discernable by visual examination under ambient light conditions at the viewing distance of 10 cm from the sample surface. Each 0.9 cm lane area, when viewed under ambient light conditions at 45 degrees incidence angle had a visibly discernable surface-scattering induced brightness.

Example 7. Transfer-Based Micro Embossed Article

The adhesive surface of 8518 film was laminated to the second reflective layer surface of the transfer stack of Preparative Example 3. The TORAYFAN PMX2 release liner was removed leaving an air-facing (first acrylate layer out) transfer stack on the 8518 film surface.

The first acrylate layer was micro-embossed with a steel roller backed MicroEmbossTool3 and was backed by a 68 Shore A rubber laminator using 90 pounds per linear nip lamination force to micro-emboss the surface. The micro-embossing tool film was discarded. The "Microfracture Confirmation Test" confirmed that microfractures were present in the surface tested. The "Accelerated Weathering" test showed visible discoloration indicating oxidation of the thin second reflective Al layer as the surface turned grey.

Example 8. Transfer-Based Micro Embossed Article

The adhesive surface of 8518 film was laminated to the third acrylate layer surface of the transfer stack of Preparative Example 4. The TORAYFAN PMX 2release liner was removed leaving an air-facing (first acrylate layer out) transfer stack on the 8518 film surface.

The first acrylate layer was micro-embossed with a steel roller backed MicroEmbossTool3 and was backed by a 68 Shore A rubber laminator using 90 pounds per linear nip lamination force to micro-emboss the surface. The micro-embossing tool film was discarded. The "Microfracture Confirmation Test" confirmed microfractures were present in the surface tested. The "Accelerated Weathering" test showed little to no discoloration indicating little to no oxidation of the thin second reflective Al layer as the surface remained visibly colored.

Example 9. Transfer-Based Micro Embossed Article

The first liner was removed from the OCA and the adhesive surface was laminated to a clear 2 inch by 3 inch (5.08 cm by 7.62 cm) borosilicate glass slide. The second liner was removed from the OCA and the adhesive surface of the OCA was laminated to the third inorganic layer surface of the transfer stack of Preparative Example 5. The SiAl coated PET substrate was discarded leaving an air-facing (first acrylate layer out) transfer stack on the OCA surface.

The first acrylate layer was micro-embossed with a steel roller backed MicroEmbossTool3 and was backed by a 68 Shore A rubber laminator using 90 pounds per linear nip lamination force to micro-emboss the surface. The micro-embossing tool film was discarded. The "Microfracture Confirmation Test" confirmed that microfractures were present in the surface tested.

The 9.5 GHz Split Post Dielectric Resonator Tan Delta Measurement was determined to be 0.018.

The "NIR/Visible Scattering Ratios Test" was completed by facing the measurement setup towards the borosilicate glass slide. Measurements are shown in Table 2.

TABLE 2

| IR Transmission (Specular) 940 nm | IR Scattering Ratio (Transmission) 940 nm | IR Transmission (Specular) 850 nm | IR Scattering Ratio (Transmission) 850 nm |
|---|---|---|---|
| 0.48 | 0.011 | 0.49 | 0.01 |

Example 10. Transfer-Based Micro Embossed Article

The first liner was removed from a first OCA and the adhesive surface was laminated to a clear 2 inch by 3 inch (5.08 cm by 7.62 cm) borosilicate glass slide. The second liner was removed from the OCA and the adhesive surface of the OCA film was laminated to the third inorganic layer surface of the transfer stack of Preparative Example 5. The SiAl coated PET substrate was discarded leaving an air-facing (first acrylate layer out) transfer stack on the OCA surface.

The first acrylate layer was micro-embossed with a steel roller backed MicroEmbossTool3 and was backed by a 68 Shore A rubber laminator using 90 pounds per linear nip lamination force to micro-emboss the surface. The micro embossing tool film was discarded. The "Microfracture Confirmation Test" confirmed that microfractures were present in the surface tested.

The first liner was removed from a second OCA and the adhesive surface of the second OCA was laminated to the micro-embossed first acrylate surface. The second liner was removed from the second OCA and the adhesive surface of the OCA was laminated to a clear 2 inch by 3 inch (5.08 cm by 7.62 cm) borosilicate glass slide.

The "NIR/Visible Scattering Ratios Test" was completed by measuring towards the first glass slide. Measurements shown in Table 3.

TABLE 3

| IR Transmission (Specular) 940 nm | IR Scattering Ratio (Transmission) 940 nm | IR Transmission (Specular) 850 nm | IR Scattering Ratio (Transmission) 850 nm |
|---|---|---|---|
| 0.72 | 0.13 | 0.65 | 0.13 |

Example 11. Transfer-Based Micro Embossed Article

The adhesive surface of the 8518 film was laminated to the second reflective layer surface of the transfer stack of Preparative Example 3. The TORAYFAN PMX2 release liner was removed leaving an air-facing (first acrylate layer out) transfer stack on the 8518 film surface.

The first acrylate layer was micro-embossed with a steel roller backed MicroEmbossTool4 and was backed by a 68 Shore A rubber laminator using 90 pounds per linear nip lamination force to micro-emboss the surface. The micro-embossing tool film was discarded. The "Microfracture Confirmation Test" confirmed that microfractures were present in the surface tested. The "Microfracture Fracture Density Test" showed 123 cracks/mm$^2$.

SV480 film was then laminated to the air-facing first acrylate layer. The full construction was uniaxially stretched in the machine direction by hand to 30% elongation. Stretching broke the brittle transfer-stack construction by initiating further fracture from the indicated microfractures into discrete flakes having Feret diameters of less than about 200 microns in the stretched direction inside the hexagon pattern (as measured using a digital Keyence VHX-6000 microscope equipped with a built-in software measurement tool). Outside the hexagons in MicroEmbossTool4, the Feret diameter was greater than 200 microns in the stretched direction. These discrete flakes were not discernable by visual examination under ambient light conditions at a viewing distance of 10 cm from the sample surface.

Example 12. Micro Embossed Transfer-Based Article

The oxide surface of Preparative Example 1 was laminated to the microstructure surface of MicroEmbossTool3 at 3 feet per minute between two steel rollers at 1000 pounds per linear inch. The micro-embossing tool film was discarded. The adhesive surface of the 8518 film was laminated to the microembossed oxide surface. The TORAYFAN PMX2 release liner was removed leaving an air-facing (first acrylate layer out) transfer stack on the 8518 film surface. The "Microfracture Confirmation Test" confirmed that microfractures were present in the surface tested. The full construction was uniaxially stretched in the machine direction by hand to 30% elongation. Stretching broke the brittle transfer-stack construction by initiating further fracture from the indicated microfractures into discrete flakes having Feret diameters of less than about 200 microns in the stretched direction (as measured using a digital Keyence VHX-6000 microscope equipped with a built-in software measurement tool).

Example 13

This example describes the construction methodology for a transfer article stack including the following layered structure: [180 nm acrylate/90 nm silver/12 nm oxide] on a metallized substrate (aluminized biaxially-oriented polypropylene film under the trade name TorayFAN PMX2 commercially available from Toray Plastics (America), Inc. (North Kingstown, RI)).

Transferrable thin films were made on a vacuum coater similar to the coater described in U.S. Pat. No. 8,658,248 (Anderson et al.) and U.S. Pat. No. 7,018,713 (Padiyath, et al.). This coater was threaded up with a substrate in the form of an indefinite length roll of 980 microinch (0.0250 mm) thick, 14 inch (35.6 cm) wide TorayFAN PMX2. This substrate was then advanced at a constant line speed of 32 fpm (9.8 m/min).

A first organic layer was formed on the substrate by applying an acrylate liquid based on tricyclodecane dimethanol diacrylate, under the trade name of SARTOMER SR833S from Sartomer USA (Exton, PA), by ultrasonic atomization and flash evaporation to make a coating width of 12.5 inches (31.8 cm). This monomeric coating was subsequently cured immediately downstream with an electron beam curing gun operating at 7.0 kV and 10.0 mA. The flow of liquid monomer into the evaporator was 0.67 ml/min, the nitrogen gas flow rate was 100 sccm and the evaporator temperature was set at 500° F. (260° C.). The process drum temperature was 14° F. (−10° C.).

On top of this first organic layer, a silver reflector layer was deposited by DC sputtering of a >99% silver cathode target. The system was operated at 3 kW with a 30 fpm (9.1 meters per minute) line speed. Two subsequent depositions with the same power and line-speed were done to create a 90 nm layer of silver.

On top of this silver layer, an oxide layer of silicon aluminum oxide was deposited by AC reactive sputtering. The cathode had a Si(90%)/Al(10%) target obtained from Soleras Advanced Coatings US, of Biddeford, (ME). The voltage for the cathode during sputtering was controlled by a feed-back control loop that monitored the voltage and controlled the oxygen flow such that the voltage would remain high and not crash the target voltage. The system was operated at 16 kW of power to deposit a 12 nm thick layer of silicon aluminum oxide onto the silver reflector.

The aluminum surface of the TorayFAN PMX2 film and the first organic layer decoupled with a 180 Peel force of 7.2 g/in (0.283 g per mm) to form a transfer article.

Figure 8:
FIG. 8 is a photograph of an embossing pattern utilized in Example 13.

The transfer article was applied to an adhesive layer and embossed using a TRIZACT Foam PPS tool available from 3M, St. Paul, MN As shown in FIG. 8, when viewed under microscope under transmission mode, the metallic layers are light-blocking, and the crevasses allow light to escape and appear white in color.

Example 14

The adhesive surface of the 8518 film was laminated to the second reflective layer surface of the transfer stack of Preparative Example 3. The TORAYFAN PMX2 release liner was removed leaving an air-facing (first acrylate layer out) transfer stack on the 8518 film surface.

A Construction 14-1 was prepared by laminating SV480 to the now exposed first acrylate layer.

The construction 14-1 was applied to a vehicle exterior surface with a compound curvature, and large cracks appeared as scratches.

A Construction 14-2 was prepared, which included all the layers of Construction 14-1, except that prior to lamination of the SV480 film, the first acrylate layer was micro-embossed over a region of interest using MicroEmbossTool 5 of Example 13

Figure 9:
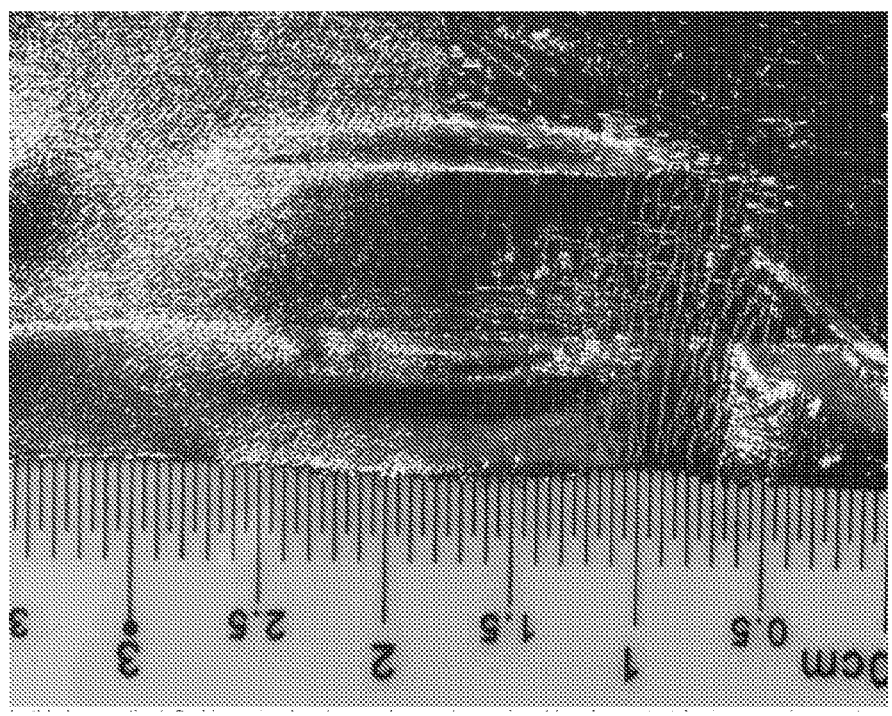
FIG. 9 is a photograph of embossed and non-embossed regions of an article of Example 13.
Figure 10:
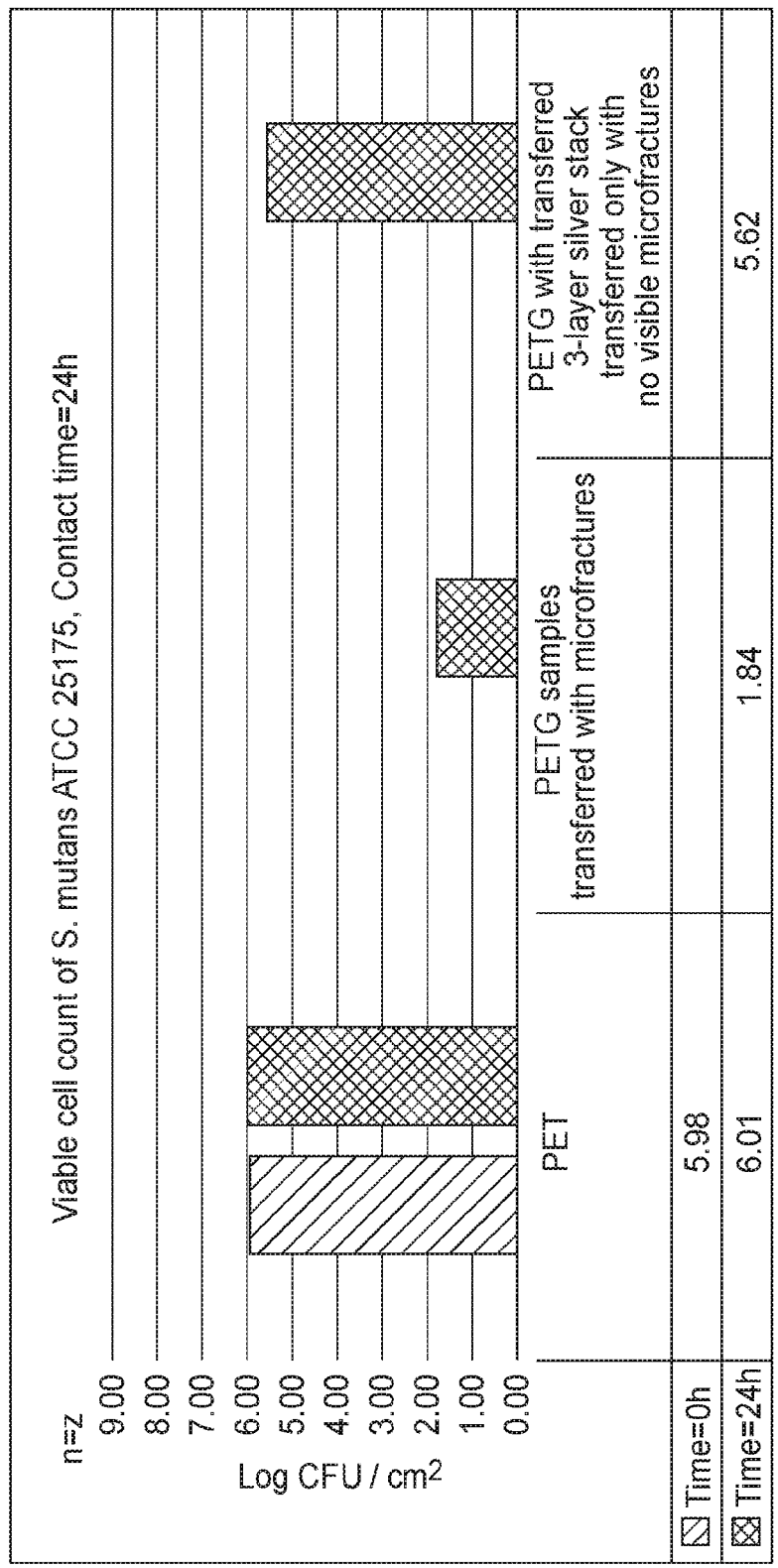
FIG. 10 is a plot of the antimicrobial performance of the articles of Example 14.

Construction 14-2 was applied to an exterior surface of a vehicle with a compound curvature, and the results are shown in FIG. 9. In FIG. 9, the left-side region has been micro-embossed and has been stretched an equal amount as the right-side region, which has not been micro-embossed. As described earlier, where there is no microembossing, large cracks are visibly apparent with the same amount of strain. Micro-embossing can improve the visual appearance of articles containing a functional layer with thin inorganic layers.

Example 15

A transfer article was prepared using the techniques described in Example 13 to provide the following layered construction: [180 nm acrylate/60 nm Ag/12 nm SiAlOx].

A Construction 15-1 was prepared that included the following layers: [180 nm acrylate/60 nm Ag/12 nm SiAlOx/PETG]. To prepare Construction 15-1, 0.75 mm thick PETG from Pacur was heated to 225° F. (107° C.) and the silver containing functional layer stack was transferred to the surface with the base acrylate facing outward.

After *S. mutans* ATCC 25175 microbiological testing was performed, Construction 15-1 showed a <0.5 Log CFU/cm$^2$ bacterial reduction.

Construction 15-2 was prepared that included Construction 15-1 with a functional layer micro-embossed using the MicroEmbossTool 5 of Example 13. After *S. mutans* ATCC 25175 microbiological testing was performed, Construction 15-2 showed a >3 Log CFU/cm$^2$ bacterial reduction. While not wishing to be bound by any theory, presently available evidence indicated that the exposed edges of the Al flakes can expose bacteria to lethal doses of Al to impart bacterial killing properties to the functional layer.

Construction 15-3 was prepared that included all the layers of Construction 15-2, except that an oxide layer was included beneath the Ag layer to prevent the optically active surface including the silver flakes from tarnishing. Samples of Construction 15-3 were exposed to a solution including 6.25 g ketchup, 6.25 g mustard and 87.5 g water for 1, 5, 10 and 60 min to assess discoloration, while other samples of Construction 15-3 were left unexposed. Substantially no silver tarnish could be observed between the exposed and unexposed samples, which indicated that the acrylate/oxide layer protected the silver layer from premature tarnishing.

Example 16

A transfer article was prepared using the techniques described in Example 13 to provide the following layered construction: [290 nm acrylate/60 nm Ag/290 nm acrylate/8 nm SiAlOx/8 nm Ge/12 nm SiAlOx/290 nm acrylate].

A Construction 16-1 was prepared in which the layered construction was applied to a layer of a black adhesive available from 3M under the trade designation CONTROL-TAC.

A split post dielectric resonator (SPDR) provides an accurate technique for measuring complex permittivity of a dielectric at a single frequency point, as set forth in IPC Standard TM-650 2.5.5.13 available at a website identified by the concatenation https://www.ipc.org/4.0_Knowledge/4.1_Standards/test/2-5-5-13.pdf. The frequency of 9.5 GHz is a convenient measurement frequency due to its location in the >5 GHz regime where future 5G mobile communication deployments are planned.

In a SPDR, the ratio of the complex permittivity to the real permittivity, i.e. the tan δ—which is proportional to the amount of electromagnetic energy lost divided by the amount of energy stored in the dielectric, can be determined for the full article (C1+C2+C3+C4) when it is measured for its dielectric properties. For non-conductive materials, the electrical permittivity tan δ is computed accurately from the measured change in the cavity resonance center frequency and the measured change in the resonance frequency band width, due to insertion of the sample into the SPDR cavity. Due to the high electrical conductivity metallic films, the cavity resonance is completely quenched and disappears after a sufficiently conductive metallic film is inserted into the SPDR cavity.

SPDR measurements of a non-embossed functional layer were too lossy due to the high electrical conductivity of the metallic films. As a result, transferred full-film metallic functional layers may not be suitable for electronic device enclosures where signal transmission loss of >10 dB may be of concern.

A Construction 16-2 was prepared, which included all the layers of Construction 16-1, except that prior to assembly the transfer stack was applied to an adhesive layer and micoembossed using the MicroEmbossTool 5 of Example 13 prior to attachment to the CONTROLTAC adhesive layer.

Figure 11:
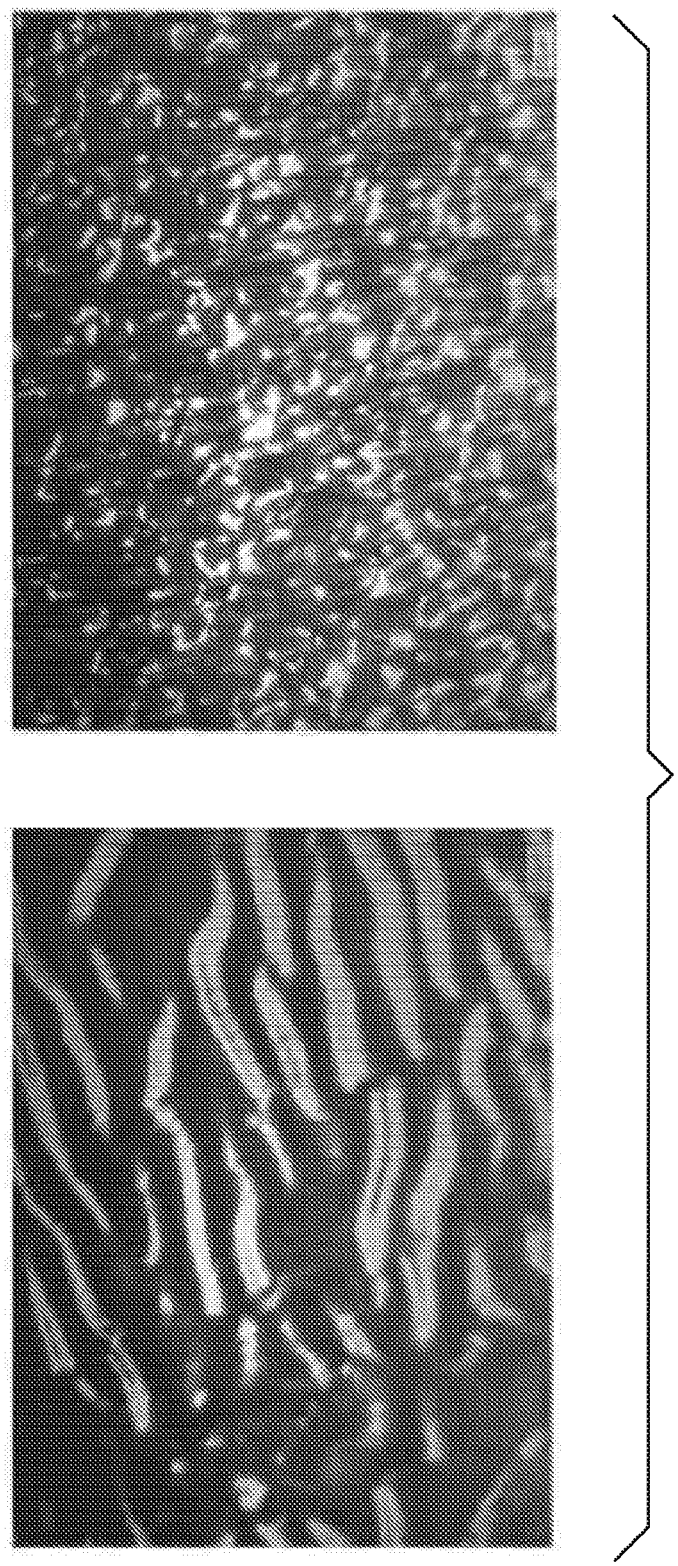
FIG. 11 is a photograph and a 9 GHz measurement of articles of Example 15.

SPDR measurements indicated a tan δ=0.067, real permittivity=14.29, complex permittivity=0.955 for Construction 16-2, which showed that micro-embossing converts the metallic film into embedded conductive flakes to create an artificial dielectric with measurable SPDR properties at 9.5 GHz. Images of the Construction 16-2 and the corresponding SPDR measurements thereof are shown in FIG. 11.

Construction 16-3 was prepared, which included the following layers: [300 nm acrylate/12 nm SiAlOx/8 nm Ge/450 nm acrylate/12 nm Al/12 nm SiAlOx/black CONTROLTAC adhesive]. Construction 16-3 was macroembossed with a tool of 3M TRIZACT ST7199 abrasive materials, which had the pyramidal structures shown in FIG. 12.

9.5 GHz SPDR measurements indicated that Construction 16-3 was too lossy after macroembossing, which showed that the metallic films therein were not sufficiently fractured to induce artificial dielectric formation at 9.5 GHz. Microembossing with a sufficient high-resolution is necessary to convert metallic thin film to flakes to form an artificial dielectric.

Construction 16-4 was prepared, which included all the layers of Construction 4-3, except that the transfer stack was applied to an adhesive layer and microembossed using the MicroEmbossTool 5 of Example 13 prior to attachment to the CONTROLTAC adhesive layer.

Figure 12:
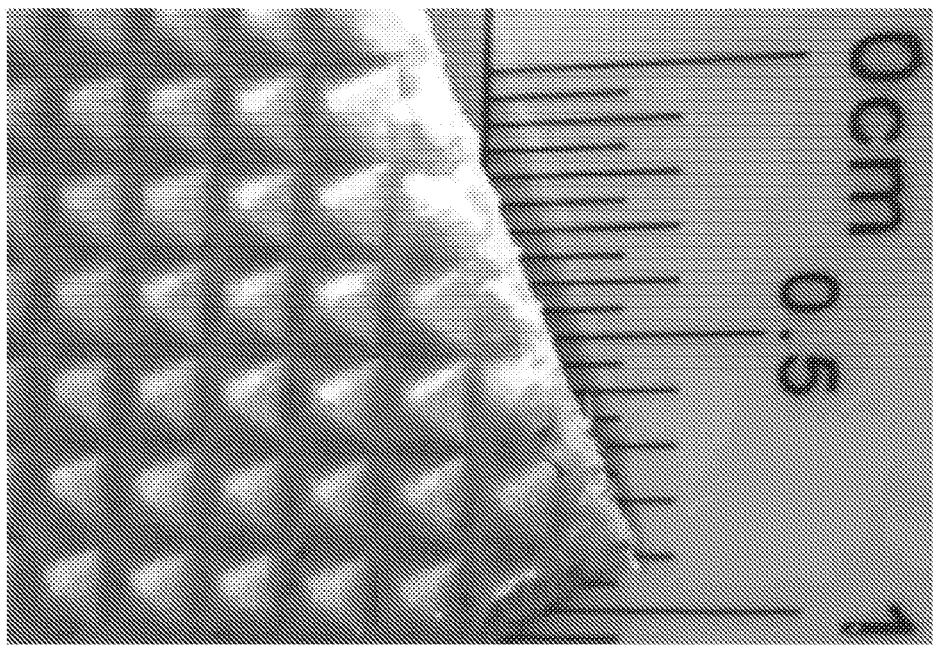
FIG. 12 is a photograph of an embossing tool utilized in Example 15.
Figure 13:
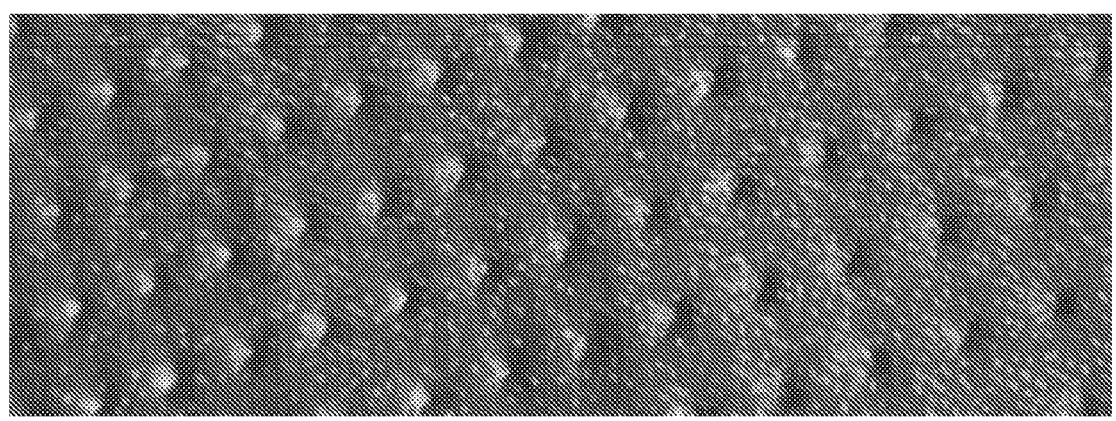
FIG. 13 is a photograph of an embossed surface of an article in Example 15.

Construction 16-4 was then macroembossed with 3M TRIZACT ST7199, which had the pyramidal structures shown in FIG. 12. The resulting construction is shown in FIG. 13.

These results show that embossing can thus be conducted in multiple steps and superimposed, which can provide a micro-embossed transfer article with relevant 5G transmission performance and desired aesthetic characteristics.

Figure 14:
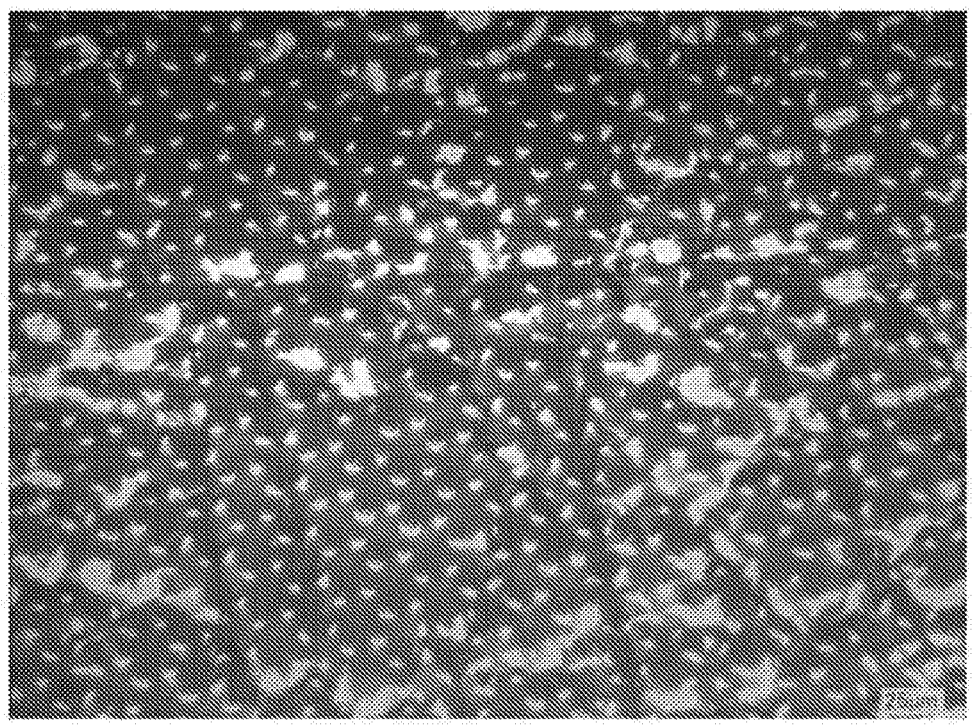
FIG. 14 is a photograph and a 9 GHz measurement of articles of Example 15.
Figure 15:
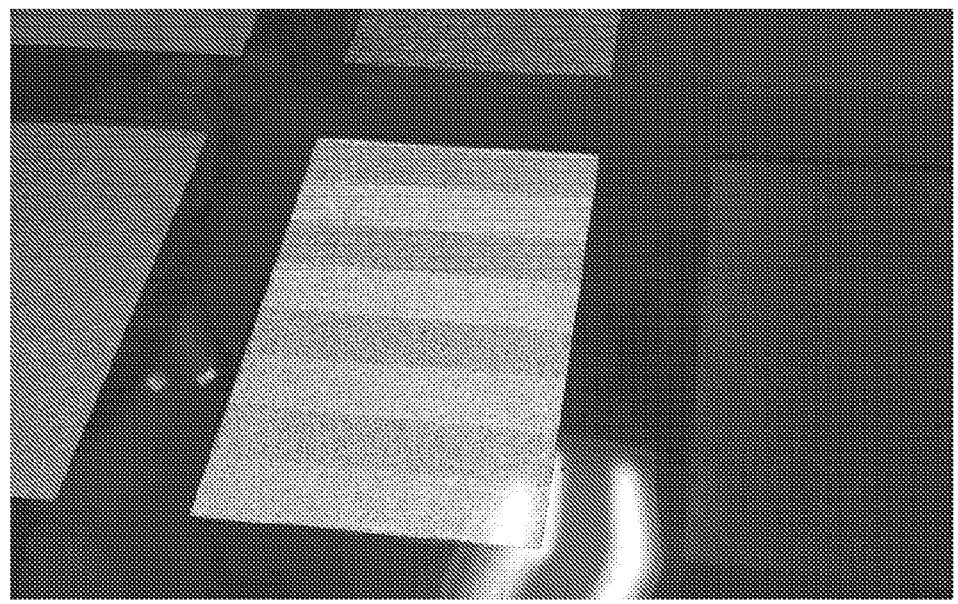
FIG. 15 is a photograph of an article of Example 15.

Construction 16-5 was prepared, which included all the layers of Construction 16-3, except that the transfer stack was applied to an adhesive layer and microembossed using a HIP prismatic diamond grade sheeting available from 3M that included cube-corner geometry with approximately 1 cm wide lanes of offset cube corners. The resulting construction is shown in FIG. 14, which had a tan δ of 0.115, an ε' of 34.48 and an ε" of 3.971. While not wishing to be bound by any theory, presently available evidence indicates that macroscopically, flakes in the microfractured metal layer were moved out of plane during the microembossing scatter light differently and create interesting visual effects.

Example 17

A transfer article was prepared using the techniques described in Example 13 to provide the following layered construction: [180 nm acrylate/60 nm Al/290 nm acrylate/9 nm Al.] The transfer article was microembossed using the MicroEmbossTool 5 of Example 13.

Construction 17-1 was prepared, which included the following layers: [0.75 mm PETG/8146 optically clear adhesive/180 nm acrylate/60 nm Al/290 nm acrylate/9 nm Al/black vinyl CONTROLTAC adhesive].

Figure 16:
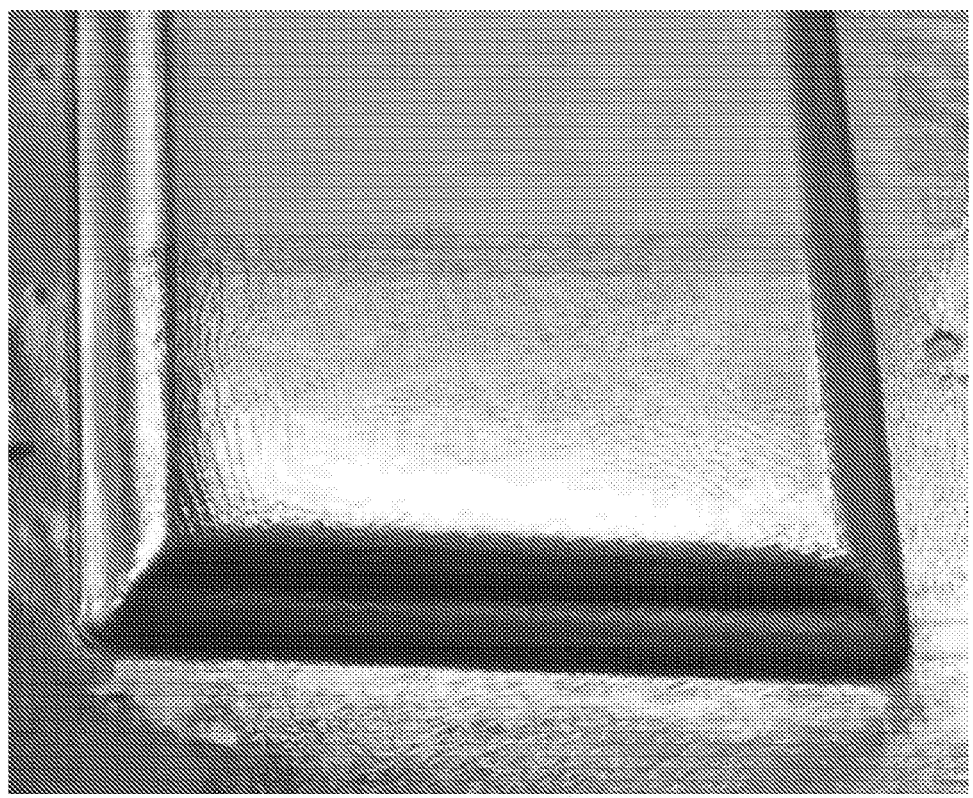
FIG. 16 is a photograph of an article of Example 16.

An Accuform thermoform was used to heat the thick PETG at 225° F. (107° C.) and formed for 5 seconds with 500 psi back pressure over metallic shapes to test forming over curves. As shown in FIG. 16, wherein the lower region was non-microembossed and the upper region was microembossed, microembossing can be useful in preventing visible crack formation.

Construction 17-2 was prepared, which including the following layers: [55 nm acrylate/59 nm NbOx/90.5 nm SiAlOx/59 nm NbOx]. The article was microembossed using the MicroEmbossTool 5 of Example 13.

Constructions such as Construction 17-2 with high index oxides (like NbOx, n~2.3 @ 550 nm) and low index acrylate or oxides can be tuned to be reflective in the visible and partially transparent in the near infrared (NIR) (wavelengths of interest are 850 nm, 940 nm, for example, because there are camera sensors and light sources that operate in these NIR wavelength windows).

Construction 17-2 was optically tested for Visible/NIR scattering performance, and were found to effectively hide (from a human observer) underlying camera sensors and light sources operating in the NIR, and had suitable forward scattering coefficients to be useful interesting for NIR sensor/detector hiding/camouflaging.

EMBODIMENTS

Embodiment A. A transfer article, comprising;
a first acrylate layer, wherein the first acrylate layer is releasable from a release layer comprising a metal layer or a doped semiconductor layer at a release value of from 2 to 50 grams/inch; and
a functional layer overlaying the first acrylate layer, wherein the functional layer comprises at least one microfractured inorganic layer comprising a plurality of toolmarks interspersed with cracks, wherein the microfractured inorganic layer is about 3 nanometers to about 200 nanometers thick; and wherein the transfer article has a thickness of less than 3 micrometers.

Embodiment B. The transfer article of Embodiment A, wherein the microfractured inorganic layer comprises about 0.3 to about 10000 cracks per mm$^2$.

Embodiment C. The transfer article of any of Embodiments A to B, wherein the microfractured inorganic layer comprises about 0.3 to about 2000 toolmarks per mm$^2$.

Embodiment D. The transfer article of any of Embodiments A to C, wherein a plurality of the cracks extend from a first major surface of the microfractured inorganic layer to a second major surface of the microfractured inorganic layer.

Embodiment E. The transfer article of any of Embodiments A to D, wherein the toolmarks in the microfractured inorganic layer are chosen from impressed marks, striation marks, cut marks, and combinations thereof.

Embodiment F. The transfer article of Embodiment E, wherein the microfractured inorganic layer comprises an array of impressed marks with an average spacing of less than about 500 microns.

Embodiment G. The transfer article of Embodiment E, wherein the impressed marks in the array have an average spacing of less than about 150 microns.

Embodiment H. The transfer article of Embodiment G, wherein the impressed marks have a depth of about 1 micron to about 10 microns.

Embodiment I. The transfer article of Embodiment E, wherein the impressed marks have a cross-sectional shape chosen from hemispherical, pyramidal, or combinations thereof.

Embodiment J. The transfer article of any of Embodiments E to I, wherein the impressed marks comprise cracks therewithin.

Embodiment K. The transfer article of any of Embodiments E to J, wherein the cracks emanate from the impressed marks.

Embodiment L. The transfer article of any of Embodiments E to K, wherein the toolmarks comprise elongate linear striation marks with an average spacing of less than about 15 mm.

Embodiment M. The transfer article of any of Embodiments A to L, wherein the microfractured inorganic layer comprises an irregular array of toolmarks separated by cracks.

Embodiment N. The transfer article of any of Embodiments A to M, wherein the microfractured inorganic layer comprises a regular array of toolmarks separated by cracks.

Embodiment O. The transfer article of any of Embodiments A to N, wherein the first acrylate layer is releasable from the release layer at a release value from 2 to 30 g/inch.

Embodiment P. The transfer article of any of Embodiments A to O, wherein the first acrylate layer is releasable from the release layer at a release value from 2 to 15 g/inch.

Embodiment Q The transfer article of any of Embodiments A to P, further comprising a low modulus layer overlaying the functional layer, wherein the low modulus layer has a modulus of about 50 MPa to about 1000 MPa.

Embodiment R. The transfer article of Embodiment Q, wherein the low modulus layer is an adhesive layer.

Embodiment S. The transfer article of Embodiment R, wherein the adhesive layer comprises an acrylic adhesive.

Embodiment T. The transfer article of any of Embodiments R to S, wherein the adhesive layer comprises a pressure sensitive adhesive.

Embodiment U. The transfer article of any of Embodiments R to S, wherein the adhesive layer comprises a pressure sensitive adhesive.

Embodiment V. The transfer article of any of Embodiments A to U, wherein a thickness of the functional layer is less than 1 µm.

Embodiment W. The transfer article of any of Embodiments A to V, wherein a thickness of the functional layer is less than 0.5 µm.

Embodiment X. The transfer article of any of Embodiments A to W, wherein the functional layer comprises a plurality of inorganic layers separated by insulating layers, and wherein at least one inorganic layer of the plurality of metal and metal oxide layers is the microfractured layer.

Embodiment Y. The transfer article of Embodiment X, wherein the inorganic layers in the plurality of inorganic layers have substantially the same thickness, and wherein each inorganic layer in the plurality of inorganic layers has a thickness of about 5 nm to about 100 nm.

Embodiment Z. The transfer article of any of Embodiments A to Y, wherein the functional layer comprises:
a first inorganic layer,
a second inorganic layer, and
a second acrylate layer, which may be the same or different than the first acrylate layer, between the first inorganic layer and the second inorganic layer, and wherein at least one of the first and the second inorganic layers is the microfractured layer.

Embodiment AA. The transfer article of Embodiment Z, wherein the first inorganic layer overlies the first acrylate layer and has a thickness greater than the thickness of the second inorganic layer, and wherein each of the first and the second inorganic layers have a thickness of less than 100 nanometers.

Embodiment BB. The transfer article of any of Embodiments Z to AA, further comprising an adhesive layer overlying the functional layer.

Embodiment CC. The transfer article of Embodiment BB, wherein the adhesive layer comprises a pressure sensitive adhesive.

Embodiment DD. The transfer article of Embodiment BB, wherein the adhesive is an acrylic adhesive.

Embodiment EE. The transfer article of any of Embodiments A to DD, wherein the microfractured inorganic layer further comprises a macropattern superimposed thereon, the pattern comprising toolmarks with a period of less than about 750 microns.

Embodiment FF. The transfer article of Embodiment EE, wherein the toolmarks comprise a regular array of impressed marks.

Embodiment GG. The transfer article of Embodiment FF, wherein the impressed marks have an average spacing of less than about 500 microns.

Embodiment HH. The transfer article of any of Embodiments A to GG, wherein the microfractured inorganic layer is a chosen from elemental metals, a mixture of two or more metals, inter-metallics or alloys, semi-metal or metalloids, metal oxides, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxy borides, metal and mixed metal silicides, diamond-like carbon, diamond-like glass, graphene, and combinations thereof.

Embodiment II. The transfer article of Embodiment HH, wherein the microfractured inorganic layer is a metal chosen from Ag, Al, Ge, Au, Si, Ni, Cr, Co, Fe and mixtures and alloys thereof.

Embodiment JJ. A method comprising applying the transfer article of any of Embodiments A to II to a surface of interest, with the functional layer adjacent to the surface of interest.

Embodiment KK. An article, comprising:
a first acrylate layer;
a functional layer overlaying the first acrylate layer, wherein the functional layer comprises at least one microfractured inorganic layer comprising a plurality of toolmarks interspersed with cracks, and wherein the microfractured inorganic layer is about 5 nm to about 100 nm thick; and
a low modulus layer on the functional layer, wherein the low modulus layer comprises at least one layer with a modulus of about 0.1 MPa to about 100 MPa.

Embodiment LL. The article of Embodiment KK, wherein the microfractured inorganic layer comprises about 0.3 to about 10000 cracks per $mm^2$.

Embodiment MM. The article of any of Embodiments KK to LL, wherein the microfractured inorganic layer comprises about 0.3 to about 2000 toolmarks per $mm^2$.

Embodiment NN. The article of any of Embodiments KK to MM, wherein a plurality of the cracks extend from a first major surface of the microfractured inorganic layer to a second major surface of the microfractured inorganic layer.

Embodiment OO. The article of any of Embodiments KK to NN, wherein the toolmarks in the microfractured inorganic layer are chosen from impressed marks, striation marks, cut marks, and combinations thereof.

Embodiment PP. The article of Embodiment OO, wherein the microfractured inorganic layer comprises an array of impressed marks with an average spacing of less than about 500 microns.

Embodiment QQ. The article of Embodiment OO, wherein the impressed marks in the array have an average spacing of less than about 150 microns.

Embodiment RR. The article of Embodiment OO, wherein the impressed marks have a depth of about 1 micron to about 10 microns.

Embodiment SS. The article of any of Embodiments OO to RR, wherein the impressed marks have a cross-sectional shape chosen from hemispherical, pyramidal, or combinations thereof.

Embodiment TT. The article of any of Embodiments OO to SS, wherein the impressed marks comprise cracks therewithin.

Embodiment UU. The article of any of Embodiments OO to TT, wherein the cracks emanate from the impressed marks.

Embodiment VV. The article of any of Embodiments OO to UU, wherein the toolmarks comprise elongate linear striation marks with an average spacing of less than about 15 mm.

Embodiment WW. The article of any of Embodiments KK to VV, wherein the microfractured inorganic layer comprises an irregular array of toolmarks separated by cracks.

Embodiment XX. The article of any of Embodiments KK to WW, wherein the microfractured inorganic layer comprises a regular array of toolmarks separated by cracks.

Embodiment YY. The article of any of Embodiments KK to XX, wherein the first acrylate layer is releasable at a release value from 2 to 30 g/inch from a release layer chosen from metals and semiconductor oxides.

Embodiment ZZ. The article of any of Embodiments KK to YY, wherein the first acrylate layer is releasable at a release value from 2 to 30 g/inch from a release layer chosen from metals and semiconductor oxides.

Embodiment AAA. The article of any of Embodiments KK to ZZ, further comprising an adhesive layer overlaying the functional layer.

Embodiment BBB. The article of any of Embodiments KK to AAA, wherein a thickness of the functional layer is less than 1 µm.

Embodiment CCC. The article of any of Embodiments KK to AAA, wherein a thickness of the functional layer is less than 0.5 µm.

Embodiment DDD. The article of any of Embodiments KK to CCC, wherein the microfractured inorganic layer comprises an irregular array of toolmarks separated by cracks.

Embodiment EEE. The article of any of Embodiments KK to DDD, wherein the microfractured inorganic layer comprises a regular array of toolmarks separated by cracks.

Embodiment FFF. The article of any of Embodiments KK to EEE, wherein the toolmarks comprise cracks therewithin.

Embodiment GGG. The article of any of Embodiments KK to FFF, wherein the functional layer comprises a plurality of inorganic layers separated by insulating layers, and wherein at least one inorganic layer of the plurality of metal layers is the microfractured inorganic layer.

Embodiment HHH. The article of Embodiment GGG, wherein the inorganic layers in the plurality of inorganic layers have substantially the same thickness, and wherein each inorganic layer in the plurality of inorganic layers has a thickness of about 5 nm to about 100 nm.

Embodiment III. The article of any of Embodiments KK to HHH, wherein the functional layer comprises a first metal layer, a second metal layer, and a second acrylate layer, which may be the same or different than the first acrylate layer, between the first metal layer and the second metal layer, and wherein at least one of the first and the second metal layers is the microfractured layer.

Embodiment JJJ. The article of Embodiment III, wherein the first metal layer overlies the first acrylate layer and has a thickness greater than the thickness of the second metal layer, and wherein each of the first and the second metal layers have a thickness of less than 100 nanometers.

Embodiment KKK. The article of any of Embodiments KK to JJJ, wherein the microfractured inorganic layer further comprises a pattern superimposed thereon, the pattern comprising toolmarks with a period of less than about 750 microns.

Embodiment LLL. The article of any of Embodiments KK to KKK, wherein the microfractured inorganic layer is a chosen from elemental metals, a mixture of two or more metals, inter-metallics or alloys, semi-metal or metalloids, metal oxides, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxy borides, metal and mixed metal silicides, diamond-like carbon, diamond-like glass, graphene, and combinations thereof.

Embodiment MMM. The transfer article of Embodiment LLL, wherein the microfractured inorganic layer is a metal chosen from Ag, Al, Ge. Au, and mixtures and alloys thereof.

Embodiment NNN. A method comprising applying the transfer article of any one of Embodiments KK to MMM to a surface of interest, with the functional layer being between the release layer and the surface of interest.

Embodiment OOO. A method for making a patterned article, the method comprising:
   removing a transfer article from a release layer chosen from a metal layer or a doped semiconductor layer, the transfer article comprising:
   a first acrylate layer overlaying the release layer, wherein a release value between the release layer and the first acrylate layer is from 2 to 50 grams/inch, and
   a functional layer overlaying the first acrylate layer, wherein the functional layer comprises at least one inorganic layer: and
   contacting the first acrylate layer with a tool comprising structures having a period of less than about 200 microns to form a plurality of toolmarks interspersed with cracks in at least one inorganic layer in the functional layer to provide a patterned article with a microfractured inorganic layer.

Embodiment PPP. The method of Embodiment OOO, further comprising laminating the functional layer of the transfer article to a layer of a low modulus material with a modulus of less than about 1000 MPa to form a patternable construction.

Embodiment QQQ. The method of Embodiment PPP, wherein the layer of the low modulus material comprises an adhesive.

Embodiment RRR. The method of Embodiment QQQ, further comprising applying, following the pattering step, the adhesive layer of the patterned article to a substrate of interest.

Embodiment SSS. The method of any of Embodiments OOO to RRR, wherein the release layer overlays a polymeric substrate.

Embodiment TTT. The method of any of Embodiments OOO to SSS, wherein a thickness of the functional layer is less than 5 µm.

Embodiment UUU. The method of any of Embodiments OOO to SSS, wherein a thickness of the functional layer is less than 1 µm.

Embodiment VVV. The method of any of Embodiments OOO to SSS, wherein a thickness of the functional layer is less than 0.5 µm.

Embodiment WWW. The method of any of Embodiments OOO to VVV, wherein the microfractured inorganic layer comprises about 0.3 to about 10000 cracks per $mm^2$.

Embodiment XXX. The method of any of Embodiments OOO to VVV, wherein the microfractured inorganic layer comprises about 0.3 to about 2000 toolmarks per $mm^2$.

Embodiment YYY. The method of any of Embodiments OOO to XXX, wherein a plurality of the cracks extend from a first major surface of the microfractured inorganic layer to a second major surface of the microfractured inorganic layer.

Embodiment ZZZ. The method of any of Embodiments OOO to YYY, wherein the toolmarks in the microfractured inorganic layer are chosen from impressed marks, striation marks, cut marks, and combinations thereof.

Embodiment AAAA. The method of Embodiment ZZZ, wherein the microfractured inorganic layer comprises an array of impressed marks with an average spacing of less than about 500 microns.

Embodiment BBBB. The method of Embodiment AAAA, wherein the impressed marks in the array have an average spacing of less than about 150 microns.

Embodiment CCCC. The method of any of Embodiments ZZZ to BBBB, wherein the impressed marks have a depth of about 1 micron to about 10 microns.

Embodiment DDDD. The method of any of Embodiments ZZZ to CCCC, wherein the impressed marks have a cross-sectional shape chosen from hemispherical, pyramidal, or combinations thereof.

Embodiment EEEE. The method of any of Embodiments ZZZ to DDDD, wherein the impressed marks comprise cracks therewithin.

Embodiment FFFF. The method of any of Embodiments ZZZ to EEEE, wherein the cracks emanate from the impressed marks.

Embodiment GGGG. The method of any of Embodiments ZZZ to FFFF, wherein the toolmarks comprise elongate linear striation marks with an average spacing of less than about 15 mm.

Embodiment HHHH. The method of any of Embodiments OOO to GGGG, wherein the microfractured inorganic layer comprises an irregular array of toolmarks separated by cracks.

Embodiment IIII. The method of any of Embodiments OOO to GGGC, wherein the microfractured inorganic layer comprises a regular array of toolmarks separated by cracks.

Embodiment JJJJ. The method of any of Embodiments OOO to IIII, wherein the functional layer comprises a plurality of metal layers separated by insulating layers, and wherein at least one metal of the plurality of metal layers is fractured against the tool.

Embodiment KKKK. The method of Embodiment JJJJ, wherein the metal layers in the plurality of metal layers have substantially the same thickness, and wherein each metal layer in the plurality of metal layers has a thickness of less than about 100 nm.

Embodiment LLLL. The method of Embodiment JJJJ, wherein the metal layers in the plurality of metal layers have substantially different thicknesses, and wherein each metal layer in the plurality of metal layer has a thickness of less than about 100 nm.

Embodiment MMMM. The method of any of Embodiments OOO to LLLL, wherein the functional layer comprises a first metal layer, a second metal layer, and a second acrylate layer between the first metal layer and the second metal layer, and wherein at least one of the first and the second metal layers is fractured against the tool.

Embodiment NNNN. The method of Embodiment MMMM, wherein the first metal layer overlies the first acrylate layer and has a thickness greater than the thickness of the second metal layer, and wherein each of the first and the second metal layers have a thickness of less than 100 nanometers.

Embodiment OOOO. The method of any of Embodiments OOO to NNNN, further comprising further patterning the patterned article one or more times to form a multi-patterned article.

Embodiment PPPP. The method of Embodiment OOOO, wherein the multi-patterned article further comprises at least one microfractured metal layer with a pattern superimposed thereon, and wherein the pattern comprises impressed toolmarks with a period of less than about 750 microns.

Embodiment QQQQ. The method of Embodiment PPPP, wherein the toolmarks comprise a regular array of impressed marks.

Embodiment RRRR. The method of Embodiment QQQQ, wherein the impressed marks have an average spacing of less than about 500 microns.

Embodiment SSSS. The method of Embodiment RRRR, wherein the impressed marks have a depth of about 1 micron to about 10 microns.

Embodiment TTTT. The method of Embodiment SSSS, wherein the impressed marks have a cross-sectional shape chosen from hemispherical, pyramidal, and mixtures and combinations thereof.

Embodiment UUUU. The method of any of Embodiments OOO to TITT, wherein the inorganic layer in the functional layer is a metal chosen from of individual metals, two or more metals as mixtures, inter-metallics or alloys, semimetal or metalloids, metal oxides, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxy borides, metal and mixed metal silicides, diamond-like carbon, diamond-like glass, graphene, and combinations thereof.

Embodiment VVVV. The method of Embodiment UUUU, wherein the metal layer is a metal chosen from Ag, Al, Se, Au, and mixtures and alloys thereof.

Embodiment WWWW. A method, comprising:
selecting a patterned transfer article comprising:
a first acrylate layer; and
a functional layer overlaying the first acrylate layer, wherein the function layer comprises at least one microfractured metal layer comprising a plurality of toolmarks interspersed with cracks, wherein the microfractured metal layer is about 5 nanometers to about 100 nanometers thick, and wherein the functional layer has a thickness of less than 3 micrometers;
applying the patterned transfer article to a substrate to form a laminate construction, wherein the laminate construction comprises a microcracked metal layer comprising a plurality of metal flakes interspersed between crevasses, wherein a plurality of the metal flakes comprise at least portion residing out of a plane of the microcracked metal layer, and wherein the crevasses have an average width of about 1 micron to about 50 microns.

Embodiment XXXX. The method of Embodiment WWWW, wherein the patterned transfer article is stretched in at least two dimensions prior to or during the applying step.

Embodiment YYYY. The method of Embodiment WWWW, wherein the patterned transfer article is stretched in three dimensions prior to or during the applying step.

Embodiment ZZZZ. The method of any of Embodiments WWWW to YYYY, wherein the patterned transfer article further comprises an adhesive layer, wherein the adhesive layer is between the patterned transfer article and the substrate in the laminate construction.

Embodiment A1. An article, comprising:
a functional layer with a first major surface and a second major surface, the functional layer comprising:
a first acrylate layer forming the first major surface, and
a functional layer on the first acrylate layer, the functional layer comprising a stack of metal layers with at least one microfractured metal layer comprising a plurality of toolmarks interspersed with cracks, and wherein the microfractured metal layer is about 5 nanometers to about 100 nanometers thick;
a first adhesive layer on the first acrylate layer, wherein the first adhesive layer is optically clear;
a first polymeric film layer on the first adhesive layer;
a second polymeric film layer on the second major surface of the functional layer; and
a second adhesive layer on a major surface of the second polymeric film layer and opposite the functional layer.

Embodiment A2. The article of Embodiment A1, further comprising a third adhesive layer between the second polymeric film and the second major surface of the functional layer.

Embodiment A3. The article of Embodiment A1, wherein the second adhesive layer comprises a bonding adhesive.

Embodiment A4. The article of any of Embodiments A1 to A3, wherein the stack of metal layers comprises a plurality of metal layers separated by insulating layers, and wherein at least one of the metal layers in the stack is the microfractured metal layer.

Embodiment A5. The article of Embodiment A4, wherein the metal layers in the plurality of metal layers have substantially the same thickness, and wherein each metal layer in the plurality of metal layer has a thickness of less than about 100 nm.

Embodiment A6. The article of any of Embodiments A1 to A3, wherein the metal layers in the plurality of metal layers have substantially different thicknesses, and wherein each metal layer in the plurality of metal layer has a thickness of less than about 100 nm.

Embodiment A7. The article of any of Embodiments A1 to A6, wherein the functional layer comprises a first metal layer, a second metal layer, and a second acrylate layer, which may be the same or different than the first acrylate layer, between the first metal layer and the second metal layer, and wherein at least one of the first and the second metal layers is a microfractured metal layer.

Embodiment A8. The article of Embodiment A7, wherein the first metal layer overlies the first acrylate layer and has a thickness greater than the thickness of the second metal layer, and wherein each of the first and the second metal layers have a thickness of less than 100 nanometers.

Embodiment A9. The article of any of Embodiments A1 to A8, wherein at least one of the metal layers in the functional layer is between barrier layers.

Embodiment A10. The article of Embodiment A9, wherein the barrier layers have a water vapor transmission rate of less than 0.1 g/m$^2$/day.

Embodiment A11. The article of Embodiment A9, wherein the barrier layers have a water vapor transmission rate of less than 0.005 g/m$^2$/day.

Embodiment A12. The article of any of Embodiments A9 to A11, wherein the barrier layers are chosen from individual metals, two or more metals as mixtures, inter-metallics or alloys, semi-metal or metalloids, metal oxides, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxy borides, metal and mixed metal silicides, diamond-like carbon, diamond-like glass, graphene, and combinations thereof.

Embodiment A13. A method comprising applying the second adhesive layer to a surface to form a laminate construction.

Embodiment A14. The method of Embodiment A13, wherein the surface has a compound curvature.

Embodiment A15. The method of Embodiment A14, comprising stretching the patterned antimicrobial article over the compound curvature of the surface such that microfractured metal layer forms a microcracked metal layer comprising a plurality of metal flakes interspersed between crevasses, wherein at least a portion of the metal flakes reside out of a plane of the microcracked metal layer, and wherein the crevasses have an average width of about 1 micron to about 50 microns.

Embodiment B1. A patterned antimicrobial article, comprising:
a functional layer comprising a first acrylate layer and a stack of metal layers and metal oxide layers on the first acrylate layer, wherein the stack of metal layers comprises at least one microfractured metal layer comprising a plurality of toolmarks interspersed with cracks, wherein the microfractured metal layer is about 5 nanometers to about 100 nanometers thick; and a substrate on the functional layer, wherein the substrate comprises a polymeric film.

Embodiment B2. The article of Embodiment Bi, wherein the metal oxide layers comprise a silver oxide.

Embodiment B3. The article of Embodiment B2, wherein the metal oxide layers comprise SiAlOx.

Embodiment B4. The article of any of Embodiments B1 to B3, wherein the substrate comprises a polyester film.

Embodiment B5. The article of Embodiment B4, wherein the polyester film comprises PETg.

Embodiment B6. The article of any of Embodiments Bi to B5, wherein the stack of metal layers comprises a silver layer on the first acrylate layer and a silver oxide layer on the silver layer.

Embodiment B7. The article of Embodiment B6, wherein the stack of metal layers comprises a first silver oxide layer on the first acrylate layer, a first major surface of a silver layer on the first silver oxide layer, and a second silver oxide layer on a second major surface of the silver layer.

Embodiment B8. A method comprising applying the substrate of Embodiment B1 on a surface to form a laminate construction.

Embodiment B9. The method of Embodiment B8, wherein the surface has a compound curvature.

Embodiment B10. The method of Embodiment B9, comprising stretching the patterned antimicrobial article over the compound curvature of the surface such that microfractured metal layer forms a microcracked metal layer comprising a plurality of metal flakes interspersed between crevasses, wherein at least a portion of the metal flakes reside out of a plane of the microcracked metal layer, and wherein the crevasses have an average width of about 1 micron to about 50 microns.

Embodiment B11. The method of Embodiment B10, wherein the metal flakes in the microfractured metal layer provide an antimicrobial reduction of greater than 3 log CFU per cm$^2$.

Embodiment B12. The method of Embodiment B11, wherein at least some of the metal flakes in the microfractured metal layer comprise exposed edges.

Embodiment B13. A patterned antimicrobial article, comprising:
  a functional layer comprising a first acrylate layer and a stack of metal layers and metal oxide layers on the first acrylate layer, wherein the stack of metal layers comprises at least one microcracked metal layer comprising a plurality of metal flakes interspersed between crevasses, wherein at least a portion of the metal flakes reside out of a plane of the microcracked metal layer, and wherein the crevasses have an average width of about 1 micron to about 50 microns; and a substrate on the functional layer, wherein the substrate comprises a polymeric film.

Embodiment C1. A dielectric article, comprising:
a patterned construction, comprising:
a functional layer comprising a first acrylate layer and a stack of metal layers and metal oxide layers on the first acrylate layer, wherein the stack of metal layers comprises at least one microcracked metal layer comprising a plurality of metal flakes interspersed between crevasses, wherein at least a portion of the metal flakes reside out of a plane of the microcracked metal layer, and wherein the crevasses have an average width of about 1 micron to about 50 microns; and
  at least one backing on the patterned construction, wherein the dielectric article has a tan δ maximum of 0.12 when measured in a QWED split post dielectric resonator cavity between 9 GHz and 10 GHz.

Embodiment C2. The dielectric article of Embodiment C1, wherein the dielectric article has a real permittivity maximum of 30.

Embodiment C3. The dielectric article of any of Embodiments C1 to C2, wherein the backing comprises a light-absorbing material.

Embodiment C4. The dielectric article of Embodiment C3, wherein the backing is a black polymeric film.

Embodiment C5. The dielectric article of any of Embodiments C1 to C4, wherein the article further comprises a formed layer on a major surface of the functional layer opposite the backing.

Embodiment C6. The dielectric article of any of Embodiments C1 to C5, wherein the backing comprises a first major surface with the patterned construction thereon and a second major surface comprising a layer of an adhesive.

Embodiment C7. The dielectric article of any of Embodiments C1 to C6, wherein the functional layer comprises a stack of acrylate layers and one of metal layers and metal oxide layers, wherein the metal layers and metal oxide layers comprise a metal chosen from Al, Ag, Ge, Ti, Ni, Cr, Si and mixtures and combinations thereof.

Embodiment C8. The dielectric article of Embodiment C7, wherein the metal layers have different thicknesses.

Embodiment C9. The dielectric article of any of Embodiments C7 to C8, wherein the stack comprises acrylate layers alternating with layers of at least one of a metal and a metal oxide.

Embodiment C10. The dielectric article of Embodiment C9, wherein the metal oxide is SiAlOx.

Embodiment C11. The dielectric article of any of Embodiments C7 to C10, wherein the metal layers have a thickness of less than 100 nm.

Embodiment C12. The dielectric article of any of Embodiments C7 to C11, wherein the stack comprises acrylate/Ag/acrylate/SiAlOx/Ge/SiAlOx/acrylate.

Embodiment C13. The dielectric article of any of Embodiments C1 to C12, wherein the patterned article comprises a second pattern superimposed over the microfractured metal layer.

Embodiment C14. The dielectric article of Embodiment C13, wherein the second pattern comprises a macroscopic pattern of structures with a period of less than about 750 microns.

Embodiment C15. The dielectric article of Embodiment C14, wherein the structures in the second pattern comprise pyramidal depressions.

Embodiment C16. A method comprising applying a patterned transfer article to a substrate to form a laminate construction, the patterned transfer article comprising functional layer comprising a first acrylate layer and a stack of metal layers and metal oxide layers on the first acrylate layer, wherein the stack of metal layers comprises at least one microfractured metal layer comprising a plurality of toolmarks interspersed with cracks, wherein the microfractured metal layer is about 5 nanometers to about 100 nanometers thick, wherein the laminate construction comprises a microcracked metal layer comprising a plurality of metal flakes interspersed between crevasses, wherein a plurality of the metal flakes comprise at least portion residing out of a plane of the microcracked metal layer, and wherein the crevasses have an average width of about 1 micron to about 50 microns.

Embodiment C17. The method of Embodiment C16, wherein the patterned transfer article is stretched in at least two dimensions prior to or during the attaching step.

Embodiment C18. The method of Embodiment C16, wherein the patterned transfer article is stretched in three dimensions prior to or during the attaching step.

Embodiment C19. The method of any of Embodiments C1 to C18, wherein the patterned transfer article further comprises an adhesive layer between the patterned transfer article and the substrate.

Embodiment C20. A method comprising applying the patterned transfer article of Embodiment C16 to a surface with a compound curvature such that the cracks in the microfractured metal layer form crevasses, and wherein at least some of the flakes separate at the crevasses and expose an edge of at least some of the flakes outside a plane of the microcracked metal layer.

Embodiment D1. An article, comprising:
  a polymeric film substrate:
  a layer of an optically clear adhesive overlaying the polymeric film substrate;
  a patterned construction overlaying the layer of the optically clear adhesive, the patterned construction comprising:

a functional layer comprising a first acrylate layer and a stack of metal layers and metal oxide layers on the first acrylate layer, wherein the stack of metal layers comprises at least one microfractured metal layer comprising a plurality of toolmarks interspersed with cracks, wherein the microfractured metal layer is about 5 nanometers to about 100 nanometers thick: and
a backing on the patterned construction.

Embodiment D2. The article of Embodiment D1, wherein the backing comprises a visible light-absorbing material.

Embodiment D3. The article of Embodiment D2, wherein the backing is a black polymeric film.

Embodiment D4. The article of any of Embodiments D1 to D3, wherein the backing comprises a first major surface with the patterned construction thereon and a second major surface comprising a layer of an adhesive.

Embodiment D5. The article of Embodiment D4, wherein the adhesive is light absorbing.

Embodiment D6. The article of Embodiment D5, wherein the adhesive is black.

Embodiment D7. The article of any of Embodiments D1 to D6, wherein the functional layer comprises a stack of acrylate layers and one of metal layers and metal oxide layers, wherein the metal layers and metal oxide layers comprise a metal chosen from Al, Ag, Ge, Ti, and mixtures and combinations thereof.

Embodiment D8. The article of Embodiment D7, wherein the metal layers have different thicknesses.

Embodiment D9. The article of any of Embodiments D7 to D8, wherein the stack comprises acrylate layers alternating with layers of at least one of a metal and a metal oxide.

Embodiment D10. The article of Embodiment D9, wherein the metal oxide is chosen from SiAlOx, NbOx and mixtures and combinations thereof.

Embodiment D11. The article of any of Embodiments D7 to D10, wherein the metal layers have a thickness of less than 100 nm.

Embodiment D12. The article of any of Embodiments D7 to D11, wherein the stack comprises alternating acrylate layers and Al layers.

Embodiment D13. The article of Embodiment D12, wherein the acrylate layers and the Al layers have different thicknesses.

Embodiment D14. The article of any of Embodiments D1 to D13, wherein the polymeric substrate comprises a thermoformable polymer.

Embodiment D15. The article of any of Embodiments D1 to D14, wherein the polymeric substrate comprises a film chosen from polyester films and polycarbonate films.

Embodiment D16. The article of Embodiment D15, wherein the polyester film is PETg.

Embodiment D17. The article of any of Embodiments D7 to D16, wherein the stack comprises acrylate layers and metal oxide layers.

Embodiment D18. The article of Embodiment D17, wherein the metal oxide layers comprise at least one layer of a metal oxide with a refractive index of at least about 2 at 550 nm.

Embodiment D19. The article of Embodiment D18, wherein the metal oxide layers are chosen from SiAlOx, NbOx, and combinations thereof.

Embodiment D20. The article of any of Embodiments D1 to D19, wherein the patterned article comprises a second pattern superimposed over the microfractured metal layer.

Embodiment D21. The article of Embodiment D20, wherein the structures in the second pattern comprise pyramidal depressions.

Embodiment D22. The article of any of Embodiments D1 to D21, wherein the article is reflective at wavelengths from 400-750 nm and at least partially transparent at wavelengths of greater than about 830 nm.

Embodiment D23. A method comprising applying a patterned transfer article to a substrate to form a laminate construction, the patterned transfer article comprising functional layer comprising a first acrylate layer and a stack of metal layers and metal oxide layers on the first acrylate layer, wherein the stack of metal layers comprises at least one microfractured metal layer comprising a plurality of toolmarks interspersed with cracks, wherein the microfractured metal layer is about 5 nanometers to about 100 nanometers thick, wherein the laminate construction comprises a microcracked metal layer comprising a plurality of metal flakes interspersed between crevasses, wherein a plurality of the metal flakes comprise at least portion residing out of a plane of the microcracked metal layer, and wherein the crevasses have an average width of about 1 micron to about 50 microns.

Embodiment D24. The method of Embodiment D23, wherein the patterned transfer article is stretched in at least two dimensions prior to or during the attaching step.

Embodiment D25. The method of Embodiment D23, wherein the patterned transfer article is stretched in three dimensions prior to or during the attaching step.

Embodiment D26. A method comprising applying the patterned transfer article of Embodiment D23 to a surface with a compound curvature such that the cracks in the microfractured metal layer form crevasses, and wherein at least some of the flakes separate at the crevasses and expose an edge of at least some of the flakes outside a plane of the microcracked metal layer.

Embodiment D27. A sensor comprising the article of any of Embodiments D1 to D26, wherein the metal oxide layers comprise a metal chosen from NbOx, SiAlOx, and combinations thereof.

Embodiment D28. The sensor of Embodiment D27, wherein the individual metal oxide layers have a thickness of less than 110 nm.

Various embodiments of the invention have been described. These and other embodiments are within the scope of the following claims.

The invention claimed is:

1. A transfer article, comprising:
a first acrylate layer, wherein the first acrylate layer is releasable from a release layer comprising a metal layer or a doped semiconductor layer at a release value of from 2 to 50 grams/inch; and
a functional layer overlaying the first acrylate layer, wherein the functional layer comprises at least one microfractured inorganic layer comprising a plurality of toolmarks interspersed with cracks, wherein the microfractured inorganic layer is about 3 nanometers to about 200 nanometers thick; and wherein the transfer article has a thickness of less than 3 micrometers.

2. The transfer article of claim 1, wherein the microfractured inorganic layer comprises about 0.3 to about 10000 cracks per mm$^2$.

3. The transfer article of claim 1, wherein the toolmarks in the microfractured inorganic layer are chosen from impressed marks, striation marks, cut marks, and combinations thereof.

4. The transfer article of claim 1, further comprising a low modulus layer overlaying the functional layer, wherein the low modulus layer has a modulus of about 50 MPa to about 1000 MPa.

5. The transfer article of claim 4, wherein the low modulus layer is an adhesive layer.

6. The transfer article of claim 1, wherein the functional layer comprises a plurality of inorganic layers separated by insulating layers, and wherein at least one inorganic layer of the plurality of metal and metal oxide layers is the microfractured layer.

7. The transfer article of claim 1, further comprising an adhesive layer overlaying the functional layer.

8. The transfer article of claim 1, wherein the microfractured inorganic layer further comprises a pattern superimposed thereon, the pattern comprising toolmarks with a period of less than about 750 microns.

9. The transfer article of claim 1, wherein the functional layer comprises
a stack of metal layers.

10. The transfer article of claim 9, wherein at least one of the metal layers in the functional layer is between barrier layers.

11. The transfer article of claim 1, wherein the functional layer comprises
a second acrylate layer and a stack of metal layers and metal oxide layers on the second acrylate layer, wherein the stack of metal layers comprises at least one microfractured silver or silver oxide layer comprising a plurality of toolmarks interspersed with cracks; and further comprising
a substrate on the functional layer, wherein the substrate comprises a polymeric film.

12. The transfer article of claim 11, wherein the polymeric film comprises PETg.

13. The transfer article of claim 1, wherein the functional layer comprises
second acrylate layer and a stack of metal layers and metal oxide layers on the second acrylate layer, wherein the stack of metal layers comprises at least one microcracked metal layer comprising a plurality of metal flakes interspersed between crevasses, wherein at least a portion of the metal flakes reside out of a plane of the microcracked metal layer, and wherein the crevasses have an average width of about 1 micron to about 50 microns.

14. The transfer article of claim 13, wherein the functional layer comprises a stack of acrylate layers and one of metal layers and metal oxide layers, wherein the metal layers and metal oxide layers have different thicknesses.

15. The transfer article of claim 1, further comprising: a polymeric film substrate on a side of the first acrylate layer opposite the functional layer; and a layer of an optically clear adhesive overlaying the polymeric film substrate; and wherein the functional layer comprises
a second acrylate layer and a stack of metal layers and metal oxide layers on the second acrylate layer, wherein the stack of metal layers comprises at least one microfractured metal layer comprising a plurality of toolmarks interspersed with cracks.

16. The transfer article of claim 15, wherein the article is reflective at wavelengths from 400-750 nm and at least partially transparent at wavelengths of greater than about 830 nm.

17. The transfer article of claim 15, wherein the metal oxide layers comprise a metal chosen from NbOx, SiAlOx, and combinations thereof.

18. A method for making a patterned article, the method comprising:
removing a transfer article from a release layer chosen from a metal layer or a doped semiconductor layer, the transfer article comprising:
a first acrylate layer overlaying the release layer, wherein a release value between the release layer and the first acrylate layer is from 2 to 50 grams/inch, and
a functional layer overlaying the first acrylate layer, wherein the functional layer comprises at least one inorganic layer; and
contacting the first acrylate layer with a tool comprising structures having a period of less than about 200 microns to form a plurality of toolmarks interspersed with cracks in at least one inorganic layer in the functional layer to provide a patterned article with a microfractured inorganic layer.

19. The method of claim 18, further comprising laminating the functional layer of the transfer article to a layer of a low modulus material with a modulus of less than about 1000 MPa to form a patternable construction.

20. The method of claim 19, wherein the layer of the low modulus material comprises an adhesive.

* * * * *